United States Patent
Cho et al.

(10) Patent No.: US 11,744,126 B2
(45) Date of Patent: Aug. 29, 2023

(54) DISPLAY DEVICE

(71) Applicant: Samsung Display Co., LTD., Yongin-si (KR)

(72) Inventors: Seung Hwan Cho, Yongin-si (KR); Jong Hyun Choi, Seoul (KR); Ju Chan Park, Seoul (KR); Seung Min Song, Gwangju (KR); Min Seong Yi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/726,891

(22) Filed: Apr. 22, 2022

(65) Prior Publication Data

US 2022/0246712 A1 Aug. 4, 2022

Related U.S. Application Data

(63) Continuation of application No. 16/814,470, filed on Mar. 10, 2020, now Pat. No. 11,316,001.

(30) Foreign Application Priority Data

Jul. 17, 2019 (KR) .......................... 10-2019-0086284

(51) Int. Cl.
*G09G 3/32* (2016.01)
*H10K 59/131* (2023.01)
*G09G 3/3266* (2016.01)
*G09G 3/3275* (2016.01)

(52) U.S. Cl.
CPC ......... *H10K 59/131* (2023.02); *G09G 3/3266* (2013.01); *G09G 3/3275* (2013.01); *G09G 2330/00* (2013.01)

(58) Field of Classification Search
CPC .............. H01L 27/3276; G09G 3/3266; G09G 3/3275; G09G 2330/00; G09G 3/327; G09G 3/36–3696
See application file for complete search history.

(56) References Cited

U.S. PATENT DOCUMENTS

| | | | |
|---|---|---|---|
| 10,971,107 B2* | 4/2021 | Chen | G02F 1/133514 |
| 11,316,001 B2* | 4/2022 | Cho | G09G 3/20 |
| 2005/0140306 A1* | 6/2005 | Park | G09G 3/3233 |
| | | | 315/169.3 |

(Continued)

FOREIGN PATENT DOCUMENTS

| | | |
|---|---|---|
| CN | 101582422 | 5/2012 |
| EP | 3 462 499 | 4/2019 |

(Continued)

*Primary Examiner* — Roy P Rabindranath
(74) *Attorney, Agent, or Firm* — Kile Park Reed & Houtteman PLLC

(57) ABSTRACT

A display device may include a display panel including a display area, a non-display area which may be disposed on a periphery of the display area, and a pad area which may be disposed on one side of the non-display area. The display panel may include data lines disposed in the display area of the display panel along a second direction which intersects a first direction, and connection lines disposed in the display area of the display panel along the first direction. A first data line among the data lines may be connected to a first connection line among the connection lines.

19 Claims, 30 Drawing Sheets

(56) References Cited

U.S. PATENT DOCUMENTS

| | | |
|---|---|---|
| 2005/0264228 A1 | 12/2005 | Kim |
| 2006/0056267 A1 | 3/2006 | Kim et al. |
| 2006/0139255 A1 | 6/2006 | Kim et al. |
| 2016/0099262 A1 | 4/2016 | Lin et al. |
| 2016/0111057 A1* | 4/2016 | Choi .................... G09G 3/3666 345/204 |
| 2017/0123506 A1* | 5/2017 | Song .................... G06F 1/1652 |
| 2017/0269416 A1 | 9/2017 | Miao et al. |
| 2018/0174553 A1* | 6/2018 | Bong .................... G09G 3/3266 |
| 2019/0206976 A1* | 7/2019 | Jeong .................... G09G 3/3275 |
| 2020/0135148 A1* | 4/2020 | Bai .................... G09G 3/20 |

FOREIGN PATENT DOCUMENTS

| | | |
|---|---|---|
| KR | 10-1486038 | 1/2015 |
| KR | 10-2018-0128517 | 12/2018 |

\* cited by examiner

DISPLAY DEVICE

CROSS REFERENCE TO RELATED APPLICATION(S)

This is a continuation application of U.S. patent application Ser. No. 16/814,470, filed Mar. 10, 2020, which issued as U.S. Pat. No. 11,316,001 on Apr. 26, 2022, the disclosure of which is incorporated herein by reference in its entirety. U.S. patent application Ser. No. 16/814,470 claims priority to and benefit of Korean Patent Application No. 10-2019-0086284 under 35 U.S.C. § 119, filed on Jul. 17, 2019, in the Korean Intellectual Property Office, the entire contents of which are incorporated herein by reference.

BACKGROUND

1. Technical Field of the Disclosure

The disclosure relates to a display device.

2. Description of the Related Art

The demand for display devices for displaying images has been increasing because of the increasing and ongoing developments of information technology. For example, display devices have been applied to a variety of electronic devices such as a smart phone, a digital camera, a notebook computer, a navigation device, a smart television (TV), and the like. Examples of display devices include flat panel display devices such as a liquid crystal display (LCD) device, a field emission display (FED) device, an organic light-emitting diode (OLED) display device, and the like.

A typical display device may include a display panel which includes pixels for displaying an image. The display panel may include a display area in which the pixels are formed and a non-display area which accounts for or corresponds to the rest of the display panel. Pads connected to a flexible film or a circuit board may be formed at a side of the display panel. Accordingly, a portion of the non-display area at a side of the display device may be larger than a portion of the non-display area at another side of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device capable of minimizing the difference in size between parts of a non-display area on both sides of the display device.

Additional features of embodiments will be set forth in the description which follows, and in part may be apparent from the description, or may be learned by practice of an embodiment herein.

According to an embodiment, a display device may include a display panel including a display area, a non-display area disposed at a periphery of the display area, and a pad area disposed at a side of the non-display area. The display device may include data lines disposed in the display area of the display panel along a second direction which may intersect a first direction, and connection lines disposed in the display area of the display panel along the first direction. A first data line among the data lines may be connected to a first connection line among the connection lines.

The pad area may protrude from the non-display area in the first direction.

A length of the display panel in the first direction may be smaller than a length of the display panel in the second direction.

The display device may include a first power supply line disposed in the display area of the display panel along the first direction and receiving a first power supply voltage. The first connection line may overlap the first power supply line.

The first connection line may be connected to the first data line through a first connection hole which penetrates at least one insulating film disposed between the first connection line and the first data line.

The first connection hole may be disposed in an overlapping area of the first data line and the first power supply line.

The display device may include scan lines disposed in the display area of the display panel along the first direction, a first gate metal layer including the scan lines, a first source metal layer disposed on the first gate metal layer and including the first data line, and a second gate metal layer disposed between the first gate metal layer and the first source metal layer and including the first power supply line.

The display device may include a second source metal layer disposed on the first source metal layer and including the first connection line.

The display device may include a second power supply line disposed in the display area of the display panel along the second direction and receiving a second power supply voltage which may be higher than the first power supply voltage.

The first source metal layer may include second power supply line.

display device includes a third source metal layer disposed on the second source metal layer. The third source metal layer may include the first connection line. The second source metal layer may be disposed on the first source metal layer, and include the second power supply line.

The display device may include a scan driver connected to the scan lines.

The scan driver may be disposed in a portion of the non-display area at a first outer side of the display area.

The scan driver may include a first scan driver disposed in a portion of the non-display area at a first outer side of the display area and is connected to odd-numbered scan lines, and a second scan driver disposed in a portion of the non-display area at a second outer side of the display area and connected to even-numbered scan lines.

The display device may include fan-out lines disposed in the pad area of the display panel and connected to the connection lines, and a display driver disposed in the pad area of the display panel and connected to the fan-out lines.

The pad area may include a bending area and a first sub-pad area in which the display driver is disposed, and the fan-out lines may be disposed in one of the first gate metal layer and the second gate metal layer in the first sub-pad area. The fan-out lines may be disposed in one of the first source metal layer and a second source metal layer disposed on the first source metal layer in the bending area.

The scan driver may be disposed in the pad area of the display panel.

The pad area may include a bending area, a first sub-pad area in which the display driver may be disposed, and a second sub-pad area disposed between the bending area and the first sub-pad area and including a scan driver.

The fan-out lines may be disposed in: one of the first and second gate metal layers in the first sub-pad area, a second source metal layer disposed on the first source metal layer in the second sub-pad area, and one of the first or second source metal layers in the bending area.

The first connection line may include a first sub-connection line disposed along the first direction, and a second sub-connection line disposed along the second direction, and the second sub-connection line may be connected to the first data line.

The display device may include a demultiplexer connected between the connection lines and the fan-out lines.

A number of the connecting lines may be greater than a number of the fan-out lines.

The display device may include a second power supply line disposed in the display area of the display panel along the second direction and receiving a second power supply voltage which may be higher than the first power supply voltage, a second source metal layer disposed on the first source metal layer and including the second power supply line, a third source metal layer disposed on the second source metal layer and including the first connection line.

According to an embodiment, a display device may include a display panel including a display area, a non-display area disposed at a periphery of the display area, and a pad area disposed at a side of the non-display area, data lines disposed in the display area of the display panel along a second direction which intersects a first direction, and a first connection line disposed in the display area of the display panel and including a first sub-connection line disposed along the first direction and a second sub-connection line disposed along the second direction. A first data line among the data lines may be connected to the second sub-connection line.

The pad area may protrude from the non-display area in the first direction.

A length of the display panel in the first direction may be smaller than a length of the display panel in the second direction.

In the non-display area, the first data line may be connected to the second sub-connection line.

The second sub-connection line may be connected to the first data line through a first connection hole which penetrates at least one insulating film disposed between the second sub-connection line and the first data line.

The display device may include a first power supply line disposed in the display area of the display panel along the first direction and receiving a first power supply voltage. The first sub-connection line may overlap the first power supply line.

The display device may include a second power supply line disposed in the display area of the display panel along the second direction and receiving a second power supply voltage which may be higher than the first power supply voltage. The second sub-connection line may overlap the second power supply line.

According to an embodiment, the width of a pad area may be greater when the pad area protrudes from a non-display area in the direction parallel to the short sides of a display panel than when the pad area protrudes from the non-display area in the direction parallel to the long sides of the display panel. Thus, the design and/or arrangement of fan-out lines that connect a display area and the pad area can be facilitated. Accordingly, the difference between the width of a portion of the non-display area at the outer left side of the display and the width of a portion of the non-display area at the outer right side of the display area can be minimized.

Connecting wires may overlap power supply lines in the thickness direction of the display panel. Due to the presence of the power supply lines, the formation of parasitic capacitance between the connection lines and switching transistors can be prevented. That is, the occurrence of coupling between the connection lines and the switching transistors due to the power supply lines can be prevented. Accordingly, the influence of data voltages applied to the connection lines on the switching transistors can be reduced or minimized.

Moreover, a scan driver may be disposed in the pad area, rather than in the non-display area. Accordingly, the difference between the width of the portion of the non-display area at the outer left side of the display area and the width of the portion of the non-display area at the outer right side of the display area can be minimized.

Other features and embodiments may be apparent from the following detailed description, the drawings, and the claims.

It is to be understood that both the foregoing description and the following detailed description are not to be construed as limiting of an embodiment as described or claimed herein.

BRIEF DESCRIPTION OF THE DRAWINGS

The accompanying drawings, which are included to provide a further understanding of the disclosure, illustrate embodiments, in which.

DETAILED DESCRIPTION OF THE EMBODIMENTS

Figure 1:
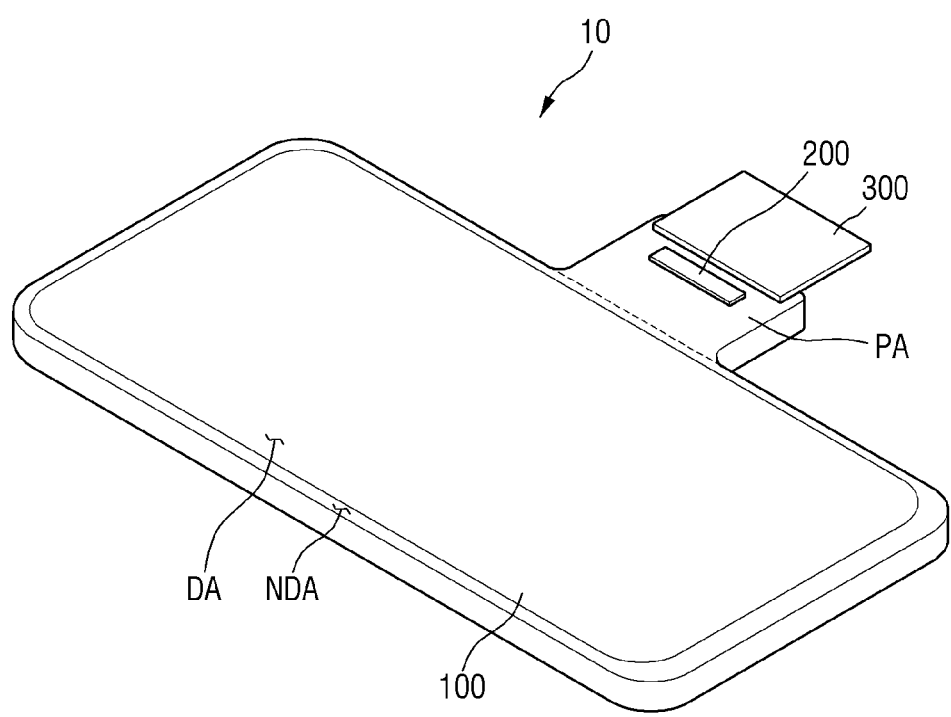
FIG. 1 is a perspective view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" mean that a first object may be above or below a second object, and vice versa. The terms "face" and "facing" mean that a first object may directly or indirectly oppose a second object. In a case in which a third object intervenes between the first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a perspective view of a display device 10 according to an embodiment.

Referring to FIGS. 1 through 4, a display device 10, for displaying images such as a moving image and/or a still image, may be used not only in a portable electronic device such as a mobile phone, a smartphone, a tablet personal computer (PC), a smart watch, a watch phone, a mobile communication terminal, an electronic notebook, an electronic book, a portable multimedia player (PMP), a navigation device, or an ultra-mobile PC (UMPC), but also in various other products such as a television (TV), a notebook computer, a monitor, a billboard, or an Internet-of-Things (IoT) device. The display device 10 may be an organic light-emitting diode (OLED) display device, a liquid crystal display (LCD) device, a plasma display device, a field emission display (FED) device, an electrophoretic display (EPD) device, an electrowetting display device, a quantum dot light-emitting diode (QLED) display device, and/or a micro light-emitting diode (mLED) display device. The display device 10 will hereinafter be described as being an OLED display device, but the embodiments are not limited thereto.

The display device 10 may include a display panel 100, a display driver 200, and a circuit board 300.

The terms "above", "top", and "top surface", as used herein, may denote an upper direction from the display panel 100, i.e., a Z-axis direction, and the terms "below", "bottom", and "bottom surface", as used herein, may denote a downward direction from the display panel 100, i.e., the opposite direction of the Z-axis direction. Also, the terms "left", "right", "upper", and "lower", as used herein, may denote respective directions of the display panel 100 as viewed from there above. For example, the term "left" may denote the opposite direction of an X-axis direction, the term "right" may denote the X-axis direction, the term "upper" may denotes a Y-axis direction, and the term "lower" may denotes the opposite direction of the Y-axis direction.

The display panel 100 may be formed as a rectangle, in a plan view, having a pair of short sides extending in a first direction (or the X-axis direction) and a pair of long sides extending in a second direction (or the Y-axis direction), which intersects the first direction (or the X-axis direction). The corners where the short sides and the long sides of the display panel 100 meet may be rounded to have a predetermined curvature or may be right-angled. The shape of the display device 10 is not particularly limited, and the display device 10 may be formed in various other polygonal shapes or in a circular or elliptical shape.

The display panel 100 may include a display area DA, a non-display area NDA, and a pad area PA.

The display area DA may be an area in which subpixels may be arranged to display an image. The non-display area NDA may be an area at the periphery of the display area DA and may not display an image. The non-display area NDA may be disposed to surround the display area DA. The pad area PA may be an area to which display driver 200 and the circuit board 300 may be attached. The pad area PA may not display an image. The pad area PA may protrude from the non-display area NDA in the first direction (or the X-axis direction). The length, in the first direction (or the X-axis direction), of the pad area PA may be smaller than the length, in the first direction (or the X-axis direction), of the display area DA. The length, in the second direction (or the Y-axis direction), of the pad area PA may be smaller than the length, in the second direction (or the Y-axis direction), of the display area DA. The display driver 200 and the circuit board 300 may be disposed in the pad area PA.

The display driver 200 may output signals and voltages for driving the display panel 100. For example, the display driver 200 may output data voltages to data lines. Also, the display driver 200 may output power supply voltages to power lines and may output scan control signals to a scan driver. The display driver 200 may be formed as an integrated circuit (IC) and may be disposed on the display panel 100, in a first sub-pad area PDA, by means of, for example, a chip-on-glass (COG) or chip-on-plastic (COP) manner or through ultrasonic bonding, but the embodiments are not limited thereto. For example, the display driver 200 may be disposed on the circuit board 300.

The circuit board 300 may be attached to the pads via, for example, an anisotropic conductive film. As a result, conductive lines of the circuit board 300 may be electrically connected to the pads of the display panel 100. The circuit board 300 may be a flexible film such as a flexible printed circuit board, a printed circuit board, or a chip-on-film.

Figure 2:
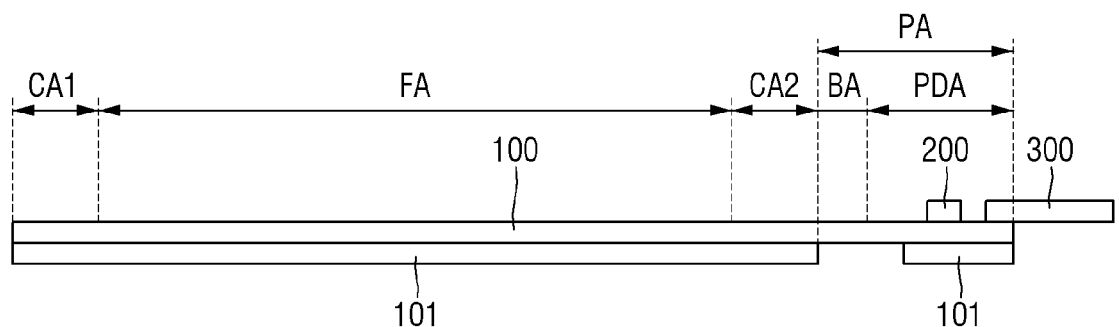
FIGS. 2 through 4 are side views of the display device of FIG. 1.
Figure 2:
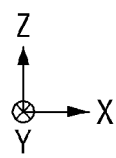
Figure 3:
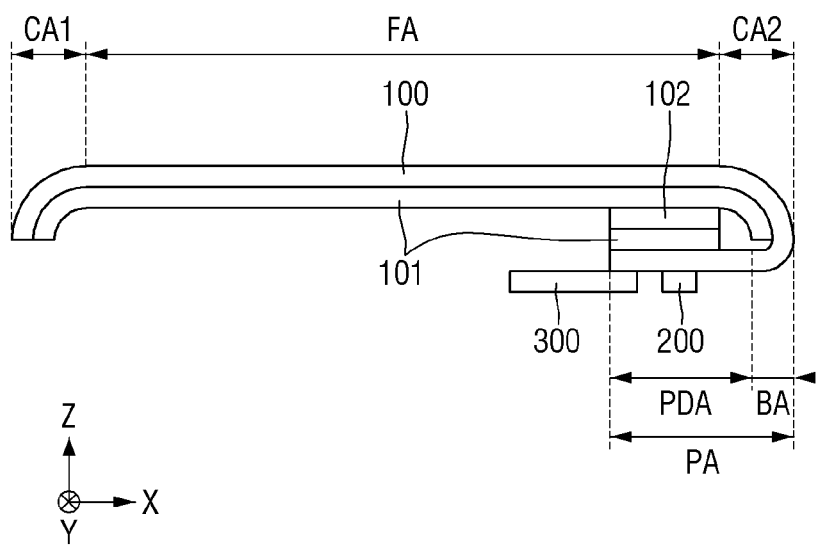
Figure 3:
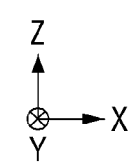
Figure 4:
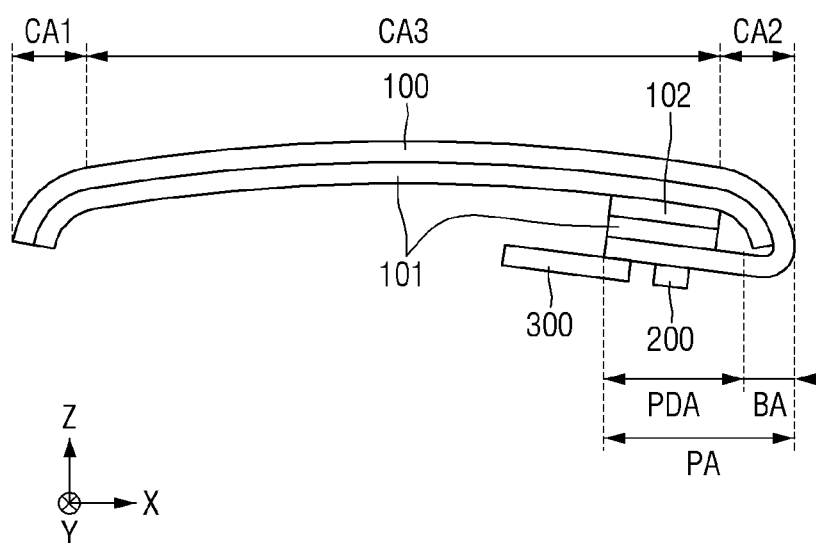

FIGS. 2 through 4 are side views of the display device 10 of FIG. 1.

Referring to FIGS. 2 through 4, the pad area PA may include a bending area BA and a first sub-pad area PDA. The first sub-pad area PDA may be disposed at a side of the bending area BA, and the non-display area NDA may be disposed at another side of the bending area BA. For example, the first sub-pad area PDA may be disposed at a right side of the bending area BA, and the non-display area NDA may be disposed at a left side of the bending area BA. The display driver 200 and the circuit board 300 may be disposed in the first sub-pad area PDA of the display panel 100.

The display panel 100 may be formed as a flexible display panel and may thus be bendable in the bending area BA. Referring to FIG. 2, before the display panel 100 is bent in the bending area BA, a first surface of the first sub-pad area PDA of the display panel 100 may face upwardly. Referring to FIG. 3, when and/or after the display panel 100 is bent in the bending area BA, the first surface of the first sub-pad area PDA of the display panel 100 may face downwardly. When and/or after the display panel 100 is bent in the bending area BA, the first sub-pad area PDA of the display panel 100 may be disposed below the display area DA. When and/or after the display panel 100 is bent in the bending area BA, the first sub-pad area PDA of the display panel 100 may overlap the display area DA in the thickness direction of the display panel 100, i.e., in the Z-axis direction.

The display panel 100 may be bent at the boundary between the non-display area NDA and the pad area PA, but the embodiments are not limited thereto. In other embodiments, the display panel 100 may not be bent at the boundary between the non-display area NDA and the pad area PA. For example, the display panel 100 may be bent at a location distant from the boundary between the non-display area NDA and the pad area PA. Such distance may be, for example, in a range of about 200 μm to 300 μm.

Referring to FIG. 3, the display panel 100 may include a flat part FA, a first curved part CA1, and a second curved part CA2. The first curved part CA1 may be curved from a first side of the flat part FA at a first curvature. The second curved part CA2 may be curved from a second side of the flat part FA at a second curvature. For example, the first and second sides of the flat part FA may be the left and right sides, respectively, of the flat part FA. The display area DA of the display panel 100 may be disposed not only in the flat part FA, but also in the first and second curved parts CA1 and CA2. Accordingly, an image can be displayed not only in the flat part FA, but also in the first and second curved parts CA1 and CA2.

FIG. 3 illustrates that the first and second curvatures of the first and second curved parts CA1 and CA2 may be substantially the same, but the embodiments are not limited thereto. In other embodiments, the first and second curvatures of the first and second curved parts CA1 and CA2 may differ from each other. In another embodiment, each of the first and second curved parts CA1 and CA2 may have a variable curvature, rather than a uniform curvature.

The display panel 100 may include only one of the first and second curved parts CA1 and CA2. In another example, the display panel 100 may not include the first and second curved parts CA1 and CA2, but may include only the flat part FA.

Referring to FIG. 4, the display panel 100 may include first, second, and third curved parts CA1, CA2, and CA3. The first curved part CA1 may be curved from a first side of the third curved part CA3 at a first curvature. The second curved part CA2 may be curved from a second side of the third curved part CA3 at a second curvature. The third curved part CA3 may be curved at a third curvature. For example, the first and second sides of the third curved part CA3 may be the left and right sides, respectively, of the third curved part CA3.

The display area DA of the display panel 100 may be disposed in the first, second, and third curved parts CA1, CA2, and CA3. Accordingly, an image may be displayed in the first, second, and third curved parts CA1, CA2, and CA3.

FIG. 4 illustrates that the first and second curvatures of the first and second curved parts CA1 and CA2 may be substantially the same, but the embodiments are not limited thereto. In other embodiments, the first and second curvatures of the first and second curved parts CA1 and CA2 may differ from each other. In another example, each of the first and second curved parts CA1 and CA2 may have a variable curvature, rather than a uniform curvature. The first and second curvatures of the first and second curved parts CA1 and CA2 may be greater than the third curvature of the third curved part CA3.

The display panel 100 may include only one of the first and second curved parts CA1 and CA2. In another example, the display panel 100 may not include the first and second curved parts CA1 and CA2, but may include only the third curved part CA3.

A panel bottom cover 101 may be disposed below the display panel 100. The panel bottom cover 101 may be attached to the bottom surface of the display panel 100 via an adhesive member, and the adhesive member may be a pressure sensitive adhesive (PSA).

The panel bottom cover 101 may include a light-absorbing member for absorbing light incident from the outside, a buffer member for absorbing shock from the outside, and a heat dissipation member for efficiently releasing heat from the display panel 100.

The light-absorbing member may be disposed below the display panel 100. The light-absorbing member may block the transmission of light and may thus prevent elements disposed there below, such as, for example, the circuit board 300 and the like, from becoming visible from above the display panel 100. The light-absorbing member may include a light-absorbing material such as a black pigment or a black dye.

The buffer member may be disposed below the light-absorbing member. The buffer member may absorb external shock and thus may prevent the display panel 100 from being damaged. The buffer member may be formed as a single- or multilayer film. For example, the buffer member may be formed of a polymer resin such as polyurethane, polycarbonate, polypropylene, polyethylene, or a combination thereof. The buffer member may include an elastic material such as rubber, a urethane-based material, a sponge foamed from an acrylic material, or a combination thereof. The buffer member may be a cushion layer.

The heat dissipation member may be disposed below the buffer member. The heat dissipation member may include a first heat dissipation layer which may include graphite or carbon nanotube and a second heat dissipation layer which may be formed as a metal thin film capable of blocking electromagnetic waves and having excellent thermal conductivity, such as, for example, a metal thin film formed of copper (Cu), nickel (Ni), ferrite, silver (Ag), or a combination thereof.

In order for the display panel 100 to be easily bendable, the panel bottom cover 101 may not be disposed in the bending area BA of the display panel 100, as illustrated, for example, in FIG. 3. A portion of the panel bottom cover 101 in the flat part FA of the display panel 100 and a portion of the panel bottom cover 101 in the first sub-pad area PDA of the display panel 100 may be attached together by an adhesive member 102. The first sub-pad area PDA of the display panel 100 may be fixed to the bottom of the flat part FA of the display panel 100. The adhesive member 102 may be a PSA. In another example, a portion of the panel bottom cover 101 in the first curved part CA1 of the display panel 100 and the portion of the panel bottom cover 101 in the first sub-pad area PDA of the display panel 100 may be attached together by the adhesive member 102. The first sub-pad area PDA of the display panel 100 may be fixed to the bottom of the first curved part CA1 of the display panel 100.

Figure 5:
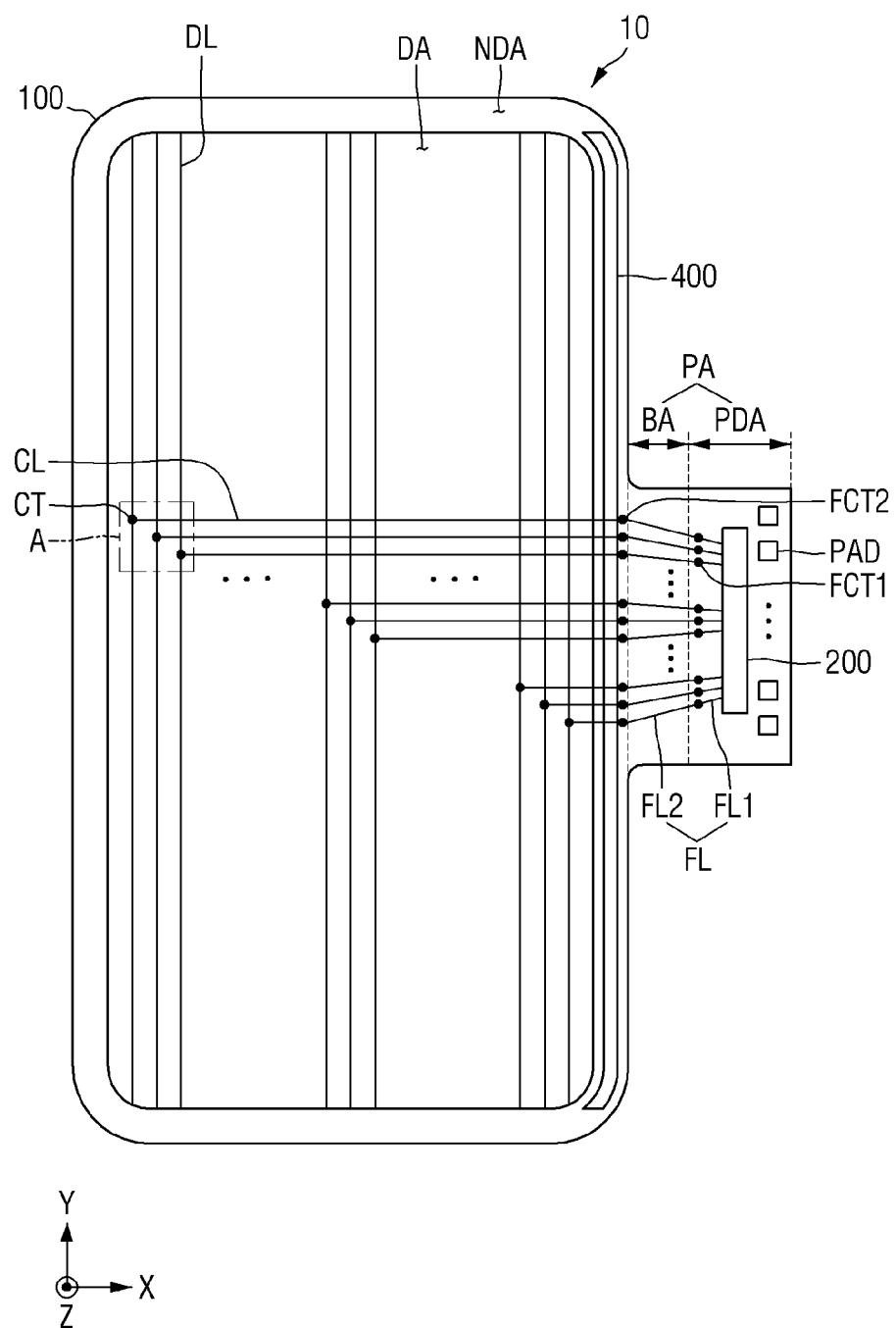
FIG. 5 is a plan view illustrating a display panel, a display driver, and a scan driver of the display device of FIG. 1.

FIG. 5 is a plan view illustrating the display panel, the display driver, and the scan driver of the display device of FIG. 1.

Referring to FIG. 5, the display panel 100 may include a display area DA, which includes subpixels and displays an image, and a non-display area NDA, which may be an area on the periphery of the display area DA. The subpixels, scan lines, data lines DL, power supply lines, and connection lines CL may be disposed in the display area DA. A scan driver 400 and fan-out lines FL may be disposed in the non-display area NDA. For the purpose of description convenience, FIG. 5 illustrates the connection lines CL, the data lines DL, and the fan-out lines FL. The subpixels, the scan lines, and the power supply lines are not illustrated in FIG. 5.

In the display area DA, the connection lines CL may extend in the first direction (or the X-axis direction), and the data lines D1 may extend in the second direction (or the Y-axis direction). The scan lines may be disposed in parallel to the connection lines CL. For example, the scan lines may extend in the first direction (or the X-axis direction).

The power supply lines may include first power supply lines to which a first power supply voltage may be applied and second power supply lines to which a second power supply voltage may be applied. The first power supply voltage may be an initialization voltage for initializing the subpixels, and the second power supply voltage may be a pixel-driving voltage for driving the subpixels. The second power supply voltage may be higher than the first power supply voltage. The first power supply lines may be disposed in parallel to the connection lines CL. For example, the first power supply lines may extend in the first direction (or the X-axis direction). The second power supply lines may be disposed in parallel to the data lines DL. For example, the second power supply lines may extend in the second direction (or the Y-axis direction).

The connection lines CL may be connected to the data lines DL through connection holes CT. The data lines DL may be connected to the connection lines CL through the connection holes CT. The connection lines CL may be connected to the data lines DL. For example, each of the connection lines CL may be connected to a corresponding one of the data lines DL.

The pad area PA includes the bending area BA and the first sub-pad area PDA, and the display driver 200 and pads PAD may be disposed in the first sub-pad area PDA. The display driver 200 may be formed as an IC and may be disposed on the display panel 100, in the first sub-pad area PDA, for example, in a COG or COP manner or through ultrasonic bonding. The circuit board 300 may be attached on the pads PAD, for example, via an anisotropic conductive film. Accordingly, the conductive lines of the circuit board 300 may be electrically connected to the pads PAD.

The fan-out lines FL may be disposed in the bending area BA and the first sub-pad area PDA. The fan-out lines FL may include first fan-out lines FL1 and second fan-out lines FL2.

The first fan-out lines FL1 may be disposed in the first sub-pad area PDA and may be connected to the display driver 200. In a portion of the first sub-pad area PDA adjacent to the bending area BA, the first fan-out lines FL1 may be connected to the second fan-out lines FL2 through first wire connection holes FCT1. The second fan-out lines FL2 may be disposed in the bending area BA. In the non-display area NDA, the second fan-out lines FL2 may be connected to the connection lines CL through second wire connection holes FCT2.

FIG. 5 illustrates that the second wire connection holes FCT2 may be disposed between the scan driver 400 and the pad area PA, but the embodiments are not limited thereto. In other embodiments, the second wire connection holes FCT2 may be disposed between the scan driver 400 and the display area DA.

The scan driver 400 may be disposed in a portion of the non-display area NDA at the outer right side of the display area DA. The scan driver 400 may be disposed between the display area DA and the bending area BA of the pad area PA.

The scan driver 400 may include thin-film transistors (TFTs). The TFTs of the scan driver 400 may be formed in the same layer as the TFTs of the subpixels in the display area DA.

According to the embodiment of FIG. 5, the pad area PA, in which the display driver 200 may be disposed, protrudes from the non-display area NDA in the first direction (or the X-axis direction), which intersects the direction in which the data lines DL extend, i.e., in the second direction (or the Y-axis direction). Thus, the data lines DL, which extend in the second direction (or the Y-axis direction), may receive data voltages from the display driver 200 via the connection lines CL, which extend in the first direction (or the X-axis direction).

In contrast to the embodiment of FIG. 5, an embodiment may include the pad area PA, in which the display driver 200 may be disposed, protruding from the non-display area NDA in the second direction (or the Y-axis direction). In the embodiment where the pad area PA protrudes from the non-display NDA in the second direction (or the Y-axis direction), the length, in the first direction (or the X-axis direction), of the pad area PA needs to be smaller than the length, in the first direction (or the X-axis direction), of the display area DA. Thus, due to the presence of the fan-out lines FL, which connect the display area DA and the pad area PA, a difference inevitably arises between the width of a portion of the non-display area NDA at the outer upper side of the display area DA and the width of a portion of the non-display area NDA at the outer lower side of the display area DA.

Referring back to FIG. 5, the pad area PA may protrude from the non-display area NDA in the first direction (or the X-axis direction), and the length, in the second direction (or the Y-axis direction), of the pad area PA may be smaller than the length, in the second direction (or the Y-axis direction), of the display area DA. The length, in the second direction (or the Y-axis direction), of the pad area PA, i.e., the width of the pad area PA when the pad area PA protrudes from the non-display area NDA in the first direction (or the X-axis direction), may be greater than the length, in the first direction (or the X-axis direction), of the pad area PA, i.e., the width of the pad area PA when the pad area PA protrudes from the non-display area NDA in the second direction (or the Y-axis direction). Thus, the design and/or arrangement of the fan-out lines FL, which connect the display area DA and the pad area PA, can be facilitated. Accordingly, the difference between the width of the portion of the non-display area NDA at the outer left side of the display area DA and the width of the portion of the non-display area NDA at the outer right side of the display area DA can be minimized.

Figure 6:
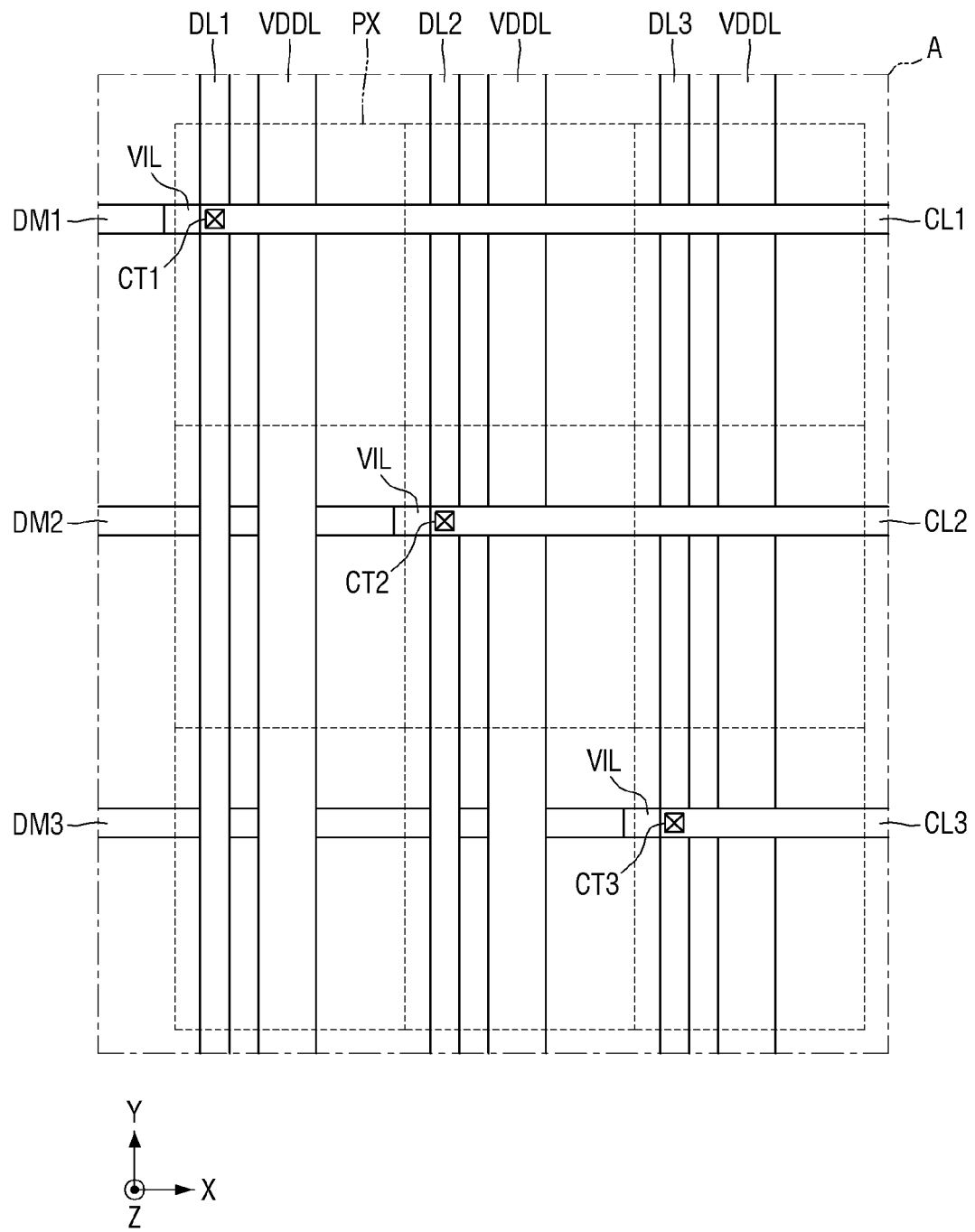
FIG. 6 is an enlarged plan view illustrating area A of FIG. 5.

FIG. 6 is an enlarged plan view illustrating area A of FIG. 5. Specifically, FIG. 6 illustrates first, second, and third data lines DL1, DL2, and DL3 and first, second, and third connection lines CL1, CL2, and CL3, which may be connected to the first, second, and third data lines DL1, DL2, and DL3, respectively.

Referring to FIG. 6, the first, second, and third connection lines CL1, CL2, and CL3 may extend in the first direction (or the X-axis direction). The first, second, and third data lines DL1, DL2, and DL3 may extend in the second direction (or the Y-axis direction). First power supply lines VIL to which the first power supply voltage may be applied may extend in the first direction (or the X-axis direction). Second power supply lines VDDL to which the second power supply voltage may be applied may extend in the second direction (or the Y-axis direction). The first power supply voltage may be an initialization voltage for initializing the subpixels, and the second power supply voltage may be a pixel-driving voltage for driving the subpixels. The second power supply voltage may be higher than the first power supply voltage.

The first, second, and third connection lines CL1, CL2, and CL3 and the first power supply lines VIL, which extend in the first direction (or the X-axis direction), may intersect the first, second, and third data lines DL1, DL2, and DL3 and the second power supply lines VDDL, which extend in the second direction (or the Y-axis direction).

The first, second, and third connection lines CL1, CL2, and CL3 may overlap the first power supply lines VIL in the thickness direction of the display panel 100, i.e., in the third direction (or the Z-axis direction). The first connection line CL1 may be connected to the first data line DL1 through a first connection hole CT1 which may be formed in the overlapping area of the first data line DL1 and a first power supply line VIL. The second connection line CL2 may be connected to the second data line DL2 through a second connection hole CT2 which may be formed in the overlapping area of the second data line DL2 and a first power supply line VIL. The third connection line CL3 may be connected to the third data line DL3 through a third connection hole CT3 which may be formed in the overlapping area of the third data line DL3 and a first power supply line VIL.

A first dummy pattern DM1 may be spaced apart in the first direction (or the X-axis direction) from the first connection line CL1 and may overlap, in the third direction (or the Z-axis direction), with the first power supply line VIL that overlaps the first connection line CL1. A second dummy pattern DM2 may be spaced apart in the first direction (or the X-axis direction) from the second connection line CL2 and may overlap, in the third direction (or the Z-axis direction), with the first power supply line VIL that overlaps the second connection line CL2. A third dummy pattern DM3 may be spaced apart in the first direction (or the X-axis direction) from the third connection line CL3 and may overlap, in the third direction (or the Z-axis direction), with the first power supply line VIL that overlaps the third connection line CL3. The first, second, and third dummy patterns DM1, DM2, and DM3 may be formed as islands and may be electrically floated. That is, no voltage may be applied to the first, second, and third dummy patterns DM1, DM2, and DM3.

Where the first, second, and third dummy patterns DM1, DM2, and DM3 may not be formed, the amount of external light reflected in regions where the first, second and third connection lines CL1, CL2, and CL3 may be disposed differs from the amount of external light reflected in regions where the first, second and third connection lines CL1, CL2, and CL3 may not be disposed, and thus, the connection lines CL1, CL2, and CL3 may be visible to a user. However, if the first, second, and third dummy patterns DM1, DM2, and DM3 may be provided in the regions where the first, second, and third connection lines CL1, CL2, and CL3 may not be disposed, the first, second and third connection lines CL1, CL2, and CL3 can be prevented from becoming visible to the user because the amount of external light reflected in the regions where the first, second and third connection lines CL1, CL2, and CL3 may be disposed may not considerably differ from the amount of external light reflected in the regions where the first, second and third connection lines CL1, CL2, and CL3 may not be disposed.

According to the embodiment of FIG. 6, the first, second, and third connection lines CL1, CL2, and CL3 may be connected to the first, second, and third data lines DL1, DL2, and DL3, respectively, through the first, second, and third connection holes CT1, CT2, and CT3, respectively. Therefore, the first, second, and third data lines DL1, DL2, and DL3, which extend in the second direction (or the Y-axis direction), can receive data voltages from the display driver 200 via the first, second, and third connection lines CL1, CL2, and CL3, which extend in the first direction (or the X-axis direction).

Figure 7:
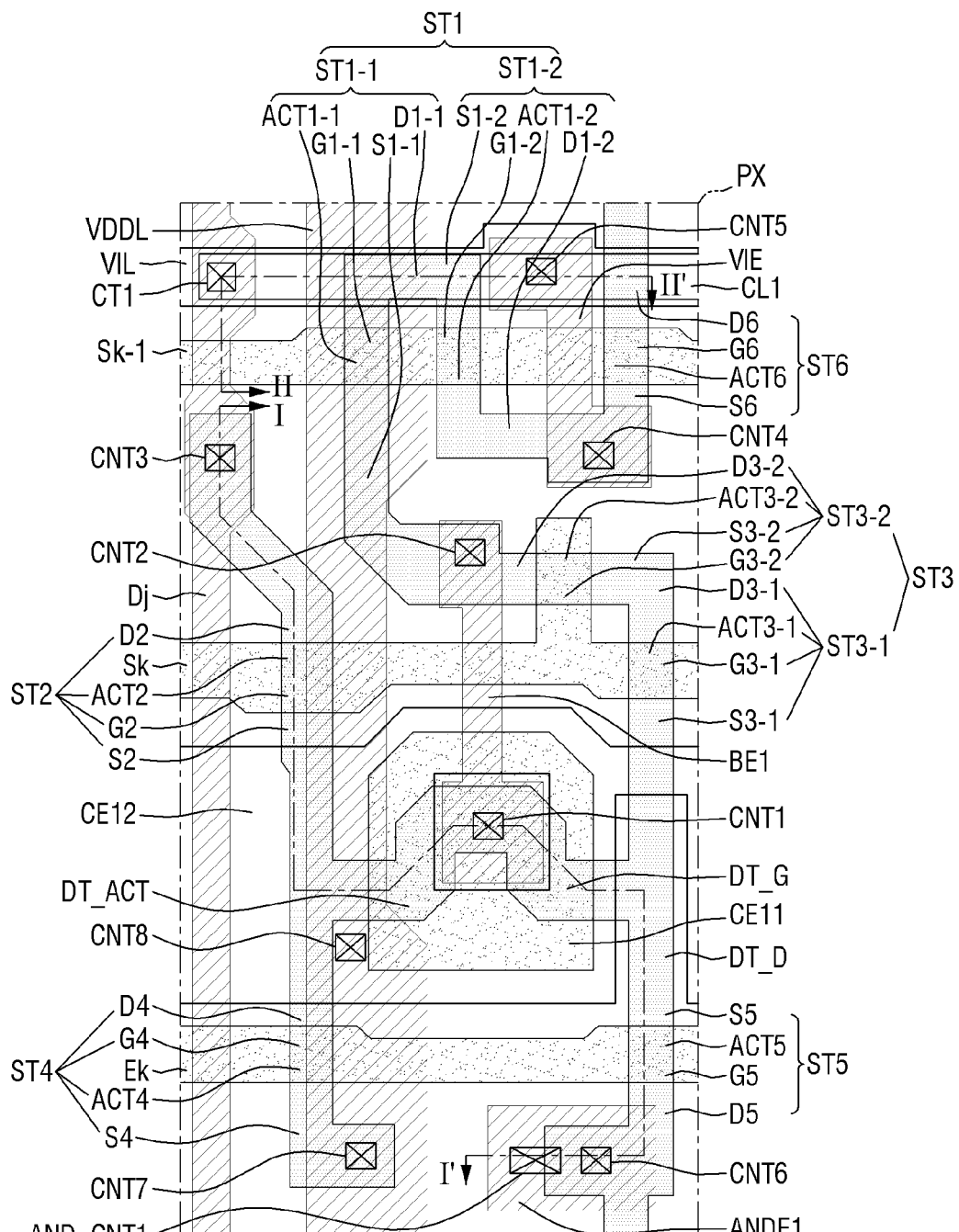
FIG. 7 is an enlarged plan view illustrating a subpixel overlapping a first data line and a first connection line of FIG. 6.

FIG. 7 is an enlarged plan view illustrating a subpixel overlapping the first data line and the first connection line of FIG. 6.

Figure 8:
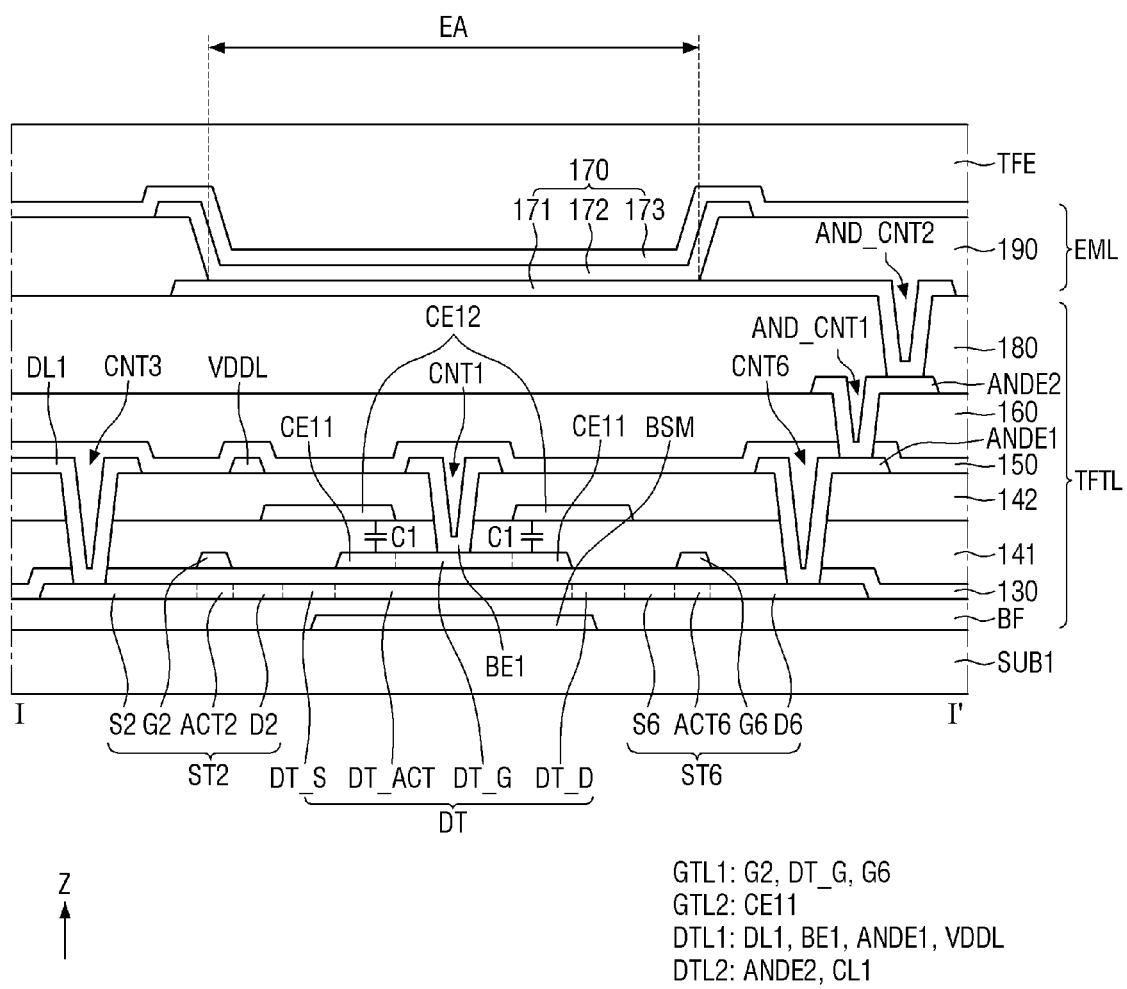
FIGS. 8 and 9 are cross-sectional views taken along lines I-I' and II-II', respectively, of FIG. 7 according to an embodiment.

Referring to FIG. 7, a subpixel may include a driving transistor DT, as also illustrated, for example, in FIG. 8, first through sixth transistors ST1 through ST6, and a capacitor C1.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT. The gate electrode DT_G of the driving transistor DT may be connected to a first connecting electrode BE1 through a first contact hole CNT1. The first connecting electrode BE1 may be connected to a first electrode S1-1 of a (1-1)-th transistor ST1-1 through a second contact hole CNT2. The first connecting electrode BE1 may intersect a k-th scan line Sk. The first electrode DT_S of the driving transistor DT may be connected to a first electrode S2 of the second transistor ST2 as illustrated, for example, in FIG. 8. The second electrode DT_D of the driving transistor DT may be connected to a first electrode S3-1 of a (3-1)-th transistor ST3-1 and a first electrode S6 of the sixth transistor ST6.

The first transistor ST1 may be formed as a dual transistor. The first transistor ST1 may include the (1-1)-th transistor ST1-1 and a (1-2)-th transistor ST1-2.

The (1-1)-th transistor ST1-1 may include an active layer ACT1-1, a gate electrode G1-1, the first electrode S1-1, and a second electrode D1-1. The gate electrode G1-1 of the (1-1)-th transistor ST1-1 may correspond to a portion of a (k−1)-th scan line Sk-1, particularly, a portion of the (k−1)-th scan line Sk-1 that overlaps the active layer ACT1-1 of the (1-1)-th transistor ST1-1. The first electrode S1-1 of the (1-1)-th transistor ST1-1 may be connected to the first connecting electrode BE1 of the driving transistor DT through the second contact hole CNT2. The second electrode D1-1 of the (1-1)-th transistor ST1-1 may be connected to a first electrode S1-2 of the (1-2)-th transistor ST1-2.

The (1-2)-th transistor ST1-2 may include an active layer ACT1-2, a gate electrode G1-2, the first electrode S1-2, and a second electrode D1-2. The gate electrode G1-2 of the (1-2)-th transistor ST1-2 may correspond to a portion of the (k−1)-th scan line Sk-1, particularly, a portion of the (k−1)-th scan line Sk-1 that overlaps the active layer ACT1-2 of the (1-2)-th transistor ST1-2. The first electrode S1-2 of the (1-2)-th transistor ST1-2 may be connected to the second electrode D1-1 of the (1-1)-th transistor ST1-1. The second electrode D1-2 of the (1-2)-th transistor ST1-2 may be connected to a second connecting electrode VIE through a fourth contact hole CNT4. The first power supply line VIL may be connected to the second connecting electrode VIE through a fifth contact hole CNT5. The second connecting electrode VIE may be disposed to intersect the (k−1)-th scan line Sk-1.

The second transistor ST2 may include an active layer ACT2, a gate electrode G2, a first electrode S2, and a second electrode D2. The gate electrode G2 of the second transistor ST2 may correspond to a portion of the k-th scan line Sk, particularly, a portion of the k-th scan line Sk that overlaps the active layer ACT2 of the second transistor ST2. The first electrode S2 of the second transistor ST2 may be connected to the first electrode DT_S of the driving transistor DT, as illustrated, for example, in FIG. 8. The second electrode D2 of the second transistor ST2 may be connected to a j-th data line Dj through a third contact hole CNT3.

The third transistor ST3 may be formed as a dual transistor. The third transistor ST3 may include the (3-1)-th transistor ST3-1 and a (3-2)-th transistor ST3-2.

The (3-1)-th transistor ST3-1 may include an active layer ACT3-1, a gate electrode G3-1, the first electrode S3-1, and a second electrode D3-1. The gate electrode G3-1 of the (3-1)-th transistor ST3-1 may correspond to a portion of the k-th scan line Sk, particularly, a portion of the -th scan line Sk that overlaps the active layer ACT3-1 of the (3-1)-th transistor ST3-1. The first electrode S3-1 of the (3-1)-th transistor ST3-1 may be connected to the second electrode DT_D of the driving transistor DT. The second electrode D3-1 of the (3-1)-th transistor ST3-1 may be connected to a first electrode S3-2 of the (3-2)-th transistor ST3-2.

The (3-2)-th transistor ST3-2 may include an active layer ACT3-2, a gate electrode G3-2, the first electrode S3-2, and a second electrode D3-2. The gate electrode G3-2 of the (3-2)-th transistor ST3-2 may correspond to a portion of the k-th scan line Sk, particularly, a portion of the k-th scan line Sk that overlaps the active layer ACT3-2 of the (3-2)-th transistor ST3-2. The first electrode S3-2 of the (3-2)-th transistor ST3-2 may be connected to the second electrode D3-1 of the (3-1)-th transistor ST3-1. The second electrode D3-2 of the (3-2)-th transistor ST3-2 may be connected to the first connecting electrode BE1 through the second contact hole CNT2.

The fourth transistor ST4 may include an active layer ACT4, a gate electrode G4, a first electrode S4, and a second electrode D4. The gate electrode G4 of the fourth transistor ST4 may correspond to a portion of a k-th emission line Ek, particularly, a portion of the k-th emission line Ek that overlaps the active layer ACT4 of the fourth transistor ST4. The first electrode S4 of the fourth transistor ST4 may be connected to a second power supply line VDDL through a seventh contact hole CNT7. The second electrode D4 of the fourth transistor ST4 may be connected to the first electrode DT_S of the driving transistor DT. The second power supply line VDDL may be connected to a second electrode CE12 of the capacitor C1 through an eighth contact hole CNT8. The second power supply line VDDL may be disposed in parallel to the j-th data line Dj.

The fifth transistor ST5 may include an active layer ACT5, a gate electrode G5, a first electrode S5, and a second electrode D5. The gate electrode G5 of the fifth transistor ST5 may correspond to a portion of the k-th emission line Ek, particularly, a portion of the k-th emission line Ek that overlaps the active layer ACT5 of the fifth transistor ST5. The first electrode S5 of the fifth transistor ST5 may be connected to the second electrode DT_D of the driving transistor DT. The second electrode D5 of the fifth transistor ST5 may be connected to a first anode connection electrode ANDE1 through a sixth contact hole CNT6.

The sixth transistor ST6 may include an active layer ACT6, a gate electrode G6, a first electrode S6, and a second electrode D6. The gate electrode G6 of the sixth transistor ST6 may correspond to a portion of the k-th scan line Sk, particularly, a portion of the k-th scan line Sk that overlaps the active layer ACT6 of the sixth transistor ST6. The first electrode S6 of the sixth transistor ST6 may be connected to the second connecting electrode VIE through the fourth contact hole CNT4. The second electrode D6 of the sixth transistor ST6 may be connected to the first anode connection electrode ANDE1 through the sixth contact hole CNT6.

The first anode connection electrode ANDE1 may be connected to the first electrode S6 of the sixth transistor ST6 through the sixth contact hole CNT6. A second anode connection electrode ANDE2 may be connected to the first anode connection electrode ANDE1 through a first anode contact hole AND_CNT1, as illustrated, for example, in FIG. 8. Referring to FIG. 8, a first electrode 171 of a light-emitting element may be connected to the first anode connection electrode ANDE1 through a second anode contact hole AND_CNT2.

A first electrode CE11 of the capacitor C1 may correspond to a portion of the gate electrode DT_G of the driving transistor DT, and the second electrode CE12 of the capacitor C1 may overlap the gate electrode DT_G of the driving transistor DT.

The first connection line CL1 may overlap the first power supply line VIL in the third direction (or the Z-axis direction). The first connection hole CT1 may be disposed in the overlapping area of the first data line DL1 and the first connection line CL1. The first connection line CL1 may be connected to the first data line DL1 through the first connection hole CT1.

Figure 9:
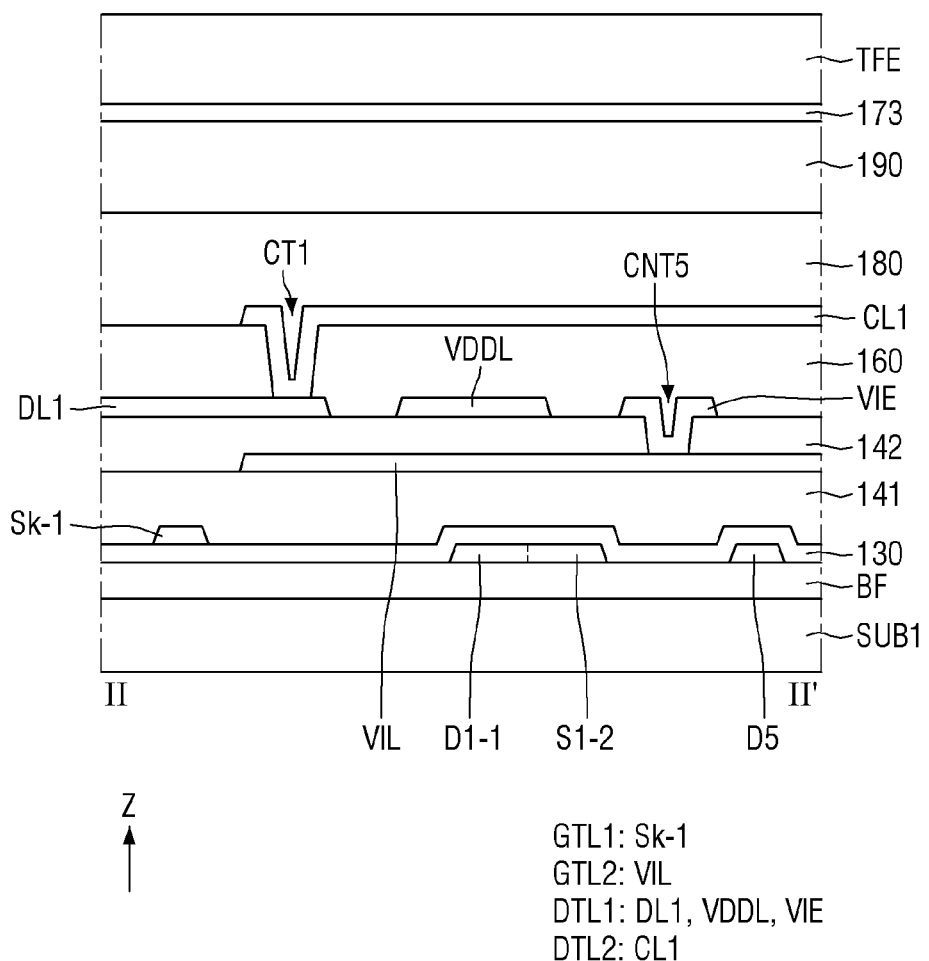

Referring to FIG. 9, the first connection line CL1 may overlap the second electrode D1-1 of the (1-1)-th transistor ST1-1 and the first electrode S1-2 of the (1-2)-th transistor ST1-2. The first connection line CL1 may overlap the second connecting electrode VIE and the second electrode D5 of the fifth transistor ST5. The first connection line CL1 may overlap a fifth contact hole CT5. The first power supply line VIL may be disposed between the first connection line CL1 and the second electrode D1-1 of the (1-1)-th transistor ST1-1, between the first connection line CL1 and the first electrode S1-2 of the (1-2)-th transistor ST1-2, and between the first connection line CL1 and the second electrode D5 of the fifth transistor ST5. Due to the presence of the first power supply line VIL, the occurrence of coupling between the first connection line CL1 and the second electrode D1-1 of the (1-1)-th transistor ST1-1, between the first connection line CL1 and the first electrode S1-2 of the (1-2)-th transistor ST1-2, and between the first connection line CL1 and the second electrode D5 of the fifth transistor ST5 can be prevented. Accordingly, the influence of the first connection line CL1 on the second electrode D1-1 of the (1-1)-th transistor ST1-1, the first electrode S1-2 of the (1-2)-th transistor ST1-2, and the second electrode D5 of the fifth transistor ST5 can be reduced or minimized.

FIGS. 8 and 9 are cross-sectional views taken along lines I-I' and II-II', respectively, of FIG. 7.

Referring to FIGS. 8 and 9, a TFT layer TFTL, a light-emitting element layer EML, and an encapsulation layer TFE may be sequentially formed on a first substrate SUB1.

The TFT layer TFTL includes a light-shielding layer BML, a buffer film BF, an active layer ACT (DT_ACT, ACT1, ACT2, ACT3, ACT4, ACT5, ACT6), a first gate layer GTL1, a second gate layer GTL2, a first source metal layer DTL1, a second source metal layer DTL2, a gate insulating film 130, a first interlayer insulating film 141, a second interlayer insulating film 142, a passivation film 150, a first planarization film 160, and a second planarization film 180.

Figure 11:
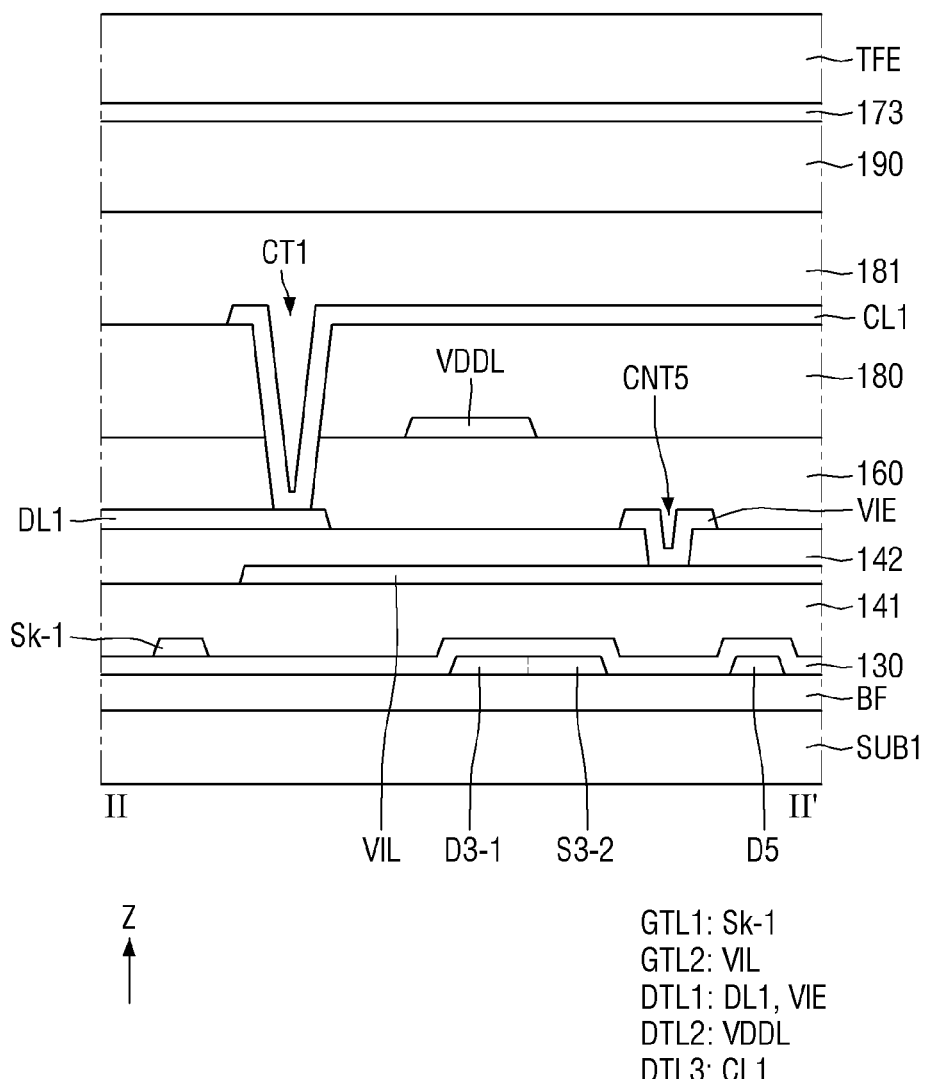

The light-shielding layer BML may be formed on one surface of the first substrate SUB1. The light-shielding layer BML may be disposed to overlap the active layer DT_ACT of the driving transistor DT to prevent the generation of a leakage current where light may be incident upon the active layer DT_ACT of the driving transistor DT. FIG. 11 illustrates that the light-shielding member BML overlaps only the active layer DT_ACT of the driving transistor DT, but the embodiments are not limited thereto. The light-shielding layer BML may overlap not only the active layer DT_ACT of the driving transistor DT, but also the active layers ACT1 through ACT6 of the first through sixth transistors ST1 through ST6. The light-shielding layer BML may be formed as a single- or multilayer film including molybdenum (Mo), aluminum (Al), chromium (Cr), gold (Au), titanium (Ti), Ni, neodymium (Nd), Cu, or an alloy thereof.

The buffer film BF may be formed on the light-shielding layer BML. The buffer film may be formed on the first substrate SUB1 to protect the TFTs 120 and organic light-emitting layers 172 of the light-emitting element layer EML against moisture that may penetrate the TFTs 120 and the organic light-emitting layers 172 through the first substrate SUB1. The buffer film BF may include inorganic films that are alternately stacked. For example, the buffer film BF may be formed as a multilayer film in which at least one of a silicon nitride layer, a silicon oxynitride layer, a silicon oxide layer, a titanium oxide layer, and an aluminum oxide layer may be alternately stacked. In another example, the buffer film BF may not be provided.

The active layers ACT may be formed on the first substrate SUB1 or on the buffer film BF. The active layer ACT may include polycrystalline silicon, monocrystalline silicon, low-temperature polycrystalline silicon, amorphous silicon, or an oxide semiconductor. Where the active layer ACT may be formed of polycrystalline silicon, the active layer ACT may have conductivity. Accordingly, the active layer ACT may include not only the active layer DT_ACT of the driving transistor DT and the active layers ACT1, ACT2, ACT3, ACT4, ACT5, and ACT6 of the first through sixth transistors ST1 through ST6, but also the source and drain electrodes DT_S and DT_D of the driving transistor DT and the source electrodes S1, S2-1, S2-2, S3-1, S3-2, S4, S5, and S6 and the drain electrodes D1, D2-1, D2-2, D3-1, D3-2, D4, D5, and D6 of the first through sixth transistors ST1 through ST6.

The gate insulating film 130 may be formed on the active layer ACT. The gate insulating film 130 may be formed as an inorganic film, for example, a silicon nitride layer, a silicon oxynitride layer, a silicon oxide layer, a titanium oxide layer, or an aluminum oxide layer.

The first gate layer GTL1 may be formed on the gate insulating film 130. The first gate layer GTL1 may include not only the gate electrode DT_G of the driving transistor DT and the gate electrodes G1 through G6 of the first through sixth transistors ST1 through ST6, but also the (k−1)- and k-th scan lines Sk-1 and Sk and the k-th emission line Ek. The scan lines may be formed of a first gate metal layer. The first gate layer GTL1 may be formed as a single- or multilayer film including Mo, Al, Cr, Au, Ti, Ni, Nd, Cu, or an alloy thereof.

The first interlayer insulating film 141 may be formed on the first gate layer GTL1. The first interlayer insulating film 141 may be formed as an inorganic film such as, for example, a silicon nitride layer, a silicon oxynitride layer, a silicon oxide layer, a titanium oxide layer, or an aluminum oxide layer. The first interlayer insulating film 141 may include inorganic films.

The second gate layer GTL2 may be formed on the first interlayer insulating film 141. The second gate layer GTL2 may include the first power supply line VIL and the second electrode CE2 of the capacitor C1. The second gate layer GTL2 may be formed as a single- or multilayer film including Mo, Al, Cr, Au, Ti, Ni, Nd, Cu, or an alloy thereof.

The second interlayer insulating film 142 may be formed on the second gate layer GTL2. The second interlayer insulating film 142 may be formed as an inorganic film such as, for example, a silicon nitride layer, a silicon oxynitride layer, a silicon oxide layer, a titanium oxide layer, or an aluminum oxide layer. The second interlayer insulating film 142 may include inorganic films.

The first source metal layer DTL1 may be formed on the second interlayer insulating film 142. The first source metal layer DTL1 may include the first data line DL1, the second power supply line VDDL, the first connecting electrode BE1, the first anode connection electrode ANDE1, and the second connecting electrode VIE. The first data line DL1 may be formed of the first source metal layer DTL1. The first source metal layer DTL1 may be formed as a single- or multilayer film including Mo, Al, Cr, Au, Ti, Ni, Nd, Cu, or an alloy thereof.

The first planarization film 160 may be formed on the first source metal layer DTL1 to planarize height differences formed by the active layer ACT, the first gate layer GTL1, the second gate layer GTL2, and the first source metal layer DTL1. The first planarization film 160 may be formed as an organic film including an acrylic resin, an epoxy resin, a phenolic resin, a polyamide resin, or a polyimide resin.

The passivation film 150 may be formed between the first source metal layer DTL1 and the first planarization film 160. The passivation film 150 may be formed as an inorganic film such as, for example, a silicon nitride layer, a silicon oxynitride layer, a silicon oxide layer, a titanium oxide layer, or an aluminum oxide layer.

The second source metal layer DTL2 may be formed on the first planarization film 160. The second source metal layer DTL2 may include the second anode connection electrode ANDE2 and the first connection line CL1. The second source metal layer DTL2 may be formed as a single- or multilayer film including Mo, Al, Cr, Au, Ti, Ni, Nd, Cu, or an alloy thereof.

The second planarization film 180 may be formed on the second source metal layer DTL2. The second planarization film 180 may be formed as an organic film including an acrylic resin, an epoxy resin, a phenolic resin, a polyamide resin, or a polyimide resin.

The driving transistor DT and the first through sixth transistors ST1 through ST6 may be top-gate transistors in which gate electrodes may be disposed above active layers, but the embodiments are not limited thereto. In other embodiments, the driving transistor DT and the first through sixth transistors ST1 through ST6 may be bottom-gate transistors in which gate electrodes are disposed below active layers or double-gate transistors in which gate electrodes may be disposed above and below active layers.

The first contact hole CNT1 may be a hole which penetrates the first and second interlayer insulating films 141 and 142 and exposes the gate electrode DT_G of the driving transistor DT. The first connecting electrode BE1 may be connected to the gate electrode DT_G of the driving transistor DT through the first contact hole CNT1.

The second contact hole CNT2 may be a hole which exposes the second electrode D3-1 of the (3-1)-th transistor ST3-1 through the gate insulating film 130 and the first and second interlayer insulating films 141 and 142. The second connecting electrode BE2 may be connected to the second electrode D3_1 of the (3-1)-th transistor ST3-1 through the second contact hole CNT2.

The third contact hole CNT3 may be a hole which exposes the first electrode S2 of the second transistor ST2 through the gate insulating film 130 and the first and second interlayer insulating films 141 and 142. The j-th data line Dj may be connected to the first electrode S2 of the second transistor ST2 through the third contact hole CNT3.

The fourth contact hole CNT4 may be a hole which exposes the second electrode D1 of the first transistor ST1 and the second electrode D4 of the fourth transistor ST4 through the gate insulating film 130 and the first and second interlayer insulating films 141 and 142. The second connecting electrode VIE may be connected to the (1-2)-th electrode of the (1-2)-th transistor ST1-2 and the second electrode D4 of the fourth transistor ST4 through the fourth contact hole CNT4.

The fifth contact hole CNT5 may be a hole which exposes the first power supply line VIL through the second interlayer insulating film 142. The second connecting electrode VIE may be connected to the first power supply line VTL through the fifth contact hole CNT5.

The sixth contact hole CNT6 may be a hole which exposes the second electrode D6 of the sixth transistor ST6 through the gate insulating film 130 and the first and second interlayer insulating films 141 and 142. The first anode connection electrode ANDE1 may be connected to the sixth transistor ST6 through the sixth contact hole CNT6.

The seventh contact hole CNT7 may be a hole which exposes the first electrode S5 of the fifth transistor ST5 through the gate insulating film 130 and the first and second interlayer insulating films 141 and 142. The second power supply line VDDL may be connected to the first electrode S4 of the fourth transistor ST4 through the seventh contact hole CNT7.

The eighth contact hole CNT8 may be a hole which exposes the second electrode CE12 of the capacitor C1 through the second interlayer insulating film 142. The second power supply line VDDL may be connected to the second electrode CE12 of the capacitor C1 through the eighth contact hole CNT8.

The first anode contact hole AND_CNT1 may be a hole which exposes the first anode connection electrode ANDE1 through the passivation film 150 and the first planarization film 160. The second anode contact hole AND_CNT2 may be a hole which exposes the second anode connection electrode ANDE2 through the second planarization film 180.

The first connection hole CT1 may be a hole which exposes the first data line DL1 through the first planarization film 160. The second and third connection holes CT2 and CT3 may be holes which expose the second and third data lines DL2 and DL3, respectively, through the first planarization film 160.

The light-emitting element layer EML may be formed on the TFT layer TFTL. The light-emitting element layer EML includes light-emitting elements 170 and a pixel-defining film 190.

The light-emitting elements 170 and the pixel-defining film 190 may be formed on the planarization film 160. Each of the light-emitting elements 170 may include a first electrode 171, an organic light-emitting layer 172, and a second electrode 173.

The first electrode 171 may be formed on the second planarization film 180. The first electrode 171 may be connected to the second anode connection electrode ANDE2 through the second anode contact hole AND_CNT2, which penetrates the second planarization film 180.

In a top-emission structure that emits light in a direction from the organic light-emitting layer 172 to the second electrode 173, the first electrode 171 may be formed of a metallic material with high reflectance such as a stack of Al and Ti (e.g., Ti/Al/Ti), a stack of Al and indium tin oxide (ITO) (e.g., ITO/Al/ITO), a silver-palladium-copper (APC) alloy, or a stack of an APC alloy and ITO (e.g., ITO/APC/ITO).

The pixel-defining film 190 may be formed to define the first electrode 171 over the second planarization film 180 and thus to define an emission area EA. The pixel-defining film 190 may be formed to cover the edges of the first electrode 171. The pixel-defining film 190 may be formed as an organic film including an acrylic resin, an epoxy resin, a phenolic resin, a polyamide resin, or a polyimide resin.

The emission area EA refers to an area where the first electrode 171, the organic light-emitting layer 172, and the second electrode 173 may be sequentially stacked so that holes from the first electrode 171 and electrons from the second electrode 173 may be combined together in the organic light-emitting layer 172 to emit light.

The organic light-emitting layer 172 may be formed on the first electrode 171 and on the pixel-defining film 190. The organic light-emitting layer 172 may include an organic material and may emit light of a predetermined color. For example, the organic light-emitting layer 172 may include a hole transport layer, an organic material layer, and an electron transport layer.

The second electrode 173 may be formed on the organic light-emitting layer 172. The second electrode 173 may be formed to cover the organic light-emitting layer 172. The second electrode 173 may be a common layer formed in common for all the subpixels. A capping layer may be formed on the second electrode 173.

In the top-emission structure, the second electrode 173 may be formed of a transparent conductive oxide (TCO) material such as ITO or IZO or a translucent metallic material such as magnesium (Mg), Ag, or an alloy of Mg and Ag. Where the second electrode 173 may be formed of a translucent metallic material, the emission efficiency of the light-emitting element layer EML can be improved due to a micro-cavity effect.

The encapsulation layer TFE may be formed on the light-emitting element layer EML. The encapsulation layer TFE may include at least one inorganic film for preventing the penetration of oxygen or moisture into the light-emitting element layer EML. Also, the encapsulation layer TFE may include at least one organic film for protecting the light-emitting element layer EML from a foreign material such as dust.

A second substrate, instead of the encapsulation layer TFE, may be disposed on the light-emitting element layer EML. The space between the light-emitting element layer EML and the second substrate may be empty in a vacuum, or a filling film may be disposed in the space between the light-emitting element layer EML and the second substrate. The filling film may be an epoxy filling film or a silicone filling film.

According to the embodiment of FIGS. 7 through 9, the first connection line CL1 may overlap the first power supply line VIL in the thickness direction of the display panel 100, i.e., in the third direction (or the Z-axis direction). Due to the presence of the first power supply line VIL, parasitic capacitance can be prevented from being formed between the first connection line CL1 and the second electrode D1-1 of the (1-1)-th transistor ST1-1, between the first connection line CL1 and the first electrode S1-2 of the (1-2)-th transistor ST1-2, and between the first connection line CL1 and the second electrode D5 of the fifth transistor ST5. That is, due to the presence of the first power supply line VIL, coupling can be prevented from being generated between the first connection line CL1 and the second electrode D1-1 of the (1-1)-th transistor ST1-1, between the first connection line CL1 and the first electrode S1-2 of the (1-2)-th transistor ST1-2, and between the first connection line CL1 and the second electrode D5 of the fifth transistor ST5. Accordingly, the influence of the data voltage applied to the first connection line CL1 on the second electrode D1-1 of the (1-1)-th transistor ST1-1, the first electrode S1-2 of the (1-2)-th transistor ST1-2, and the second electrode D5 of the fifth transistor ST5 can be reduced or minimized.

The first fan-out lines FL1 of FIG. 5 may be alternately disposed in the first and second gate metal layers GTL1 and GTL2. The second fan-out lines FL2 of FIG. 5 may be alternately disposed in the first and second source metal layers DTL1 and DTL2. The first wire connection hole FCT1 may be a hole that penetrates the first planarization film 160, the passivation film 150, and the second interlayer insulating film 142 or a hole that penetrates the passivation film 150, the second interlayer insulating film 142, and the first interlayer insulating film 141. The second wire connection hole FCT2 may not be provided in an embodiment. The second fan-out lines FL2 may be disposed in the same layer where the connection lines CL are disposed. The second fan-out lines FL2 may be connected (or directly connected) to the connection lines CL.

Figure 10:
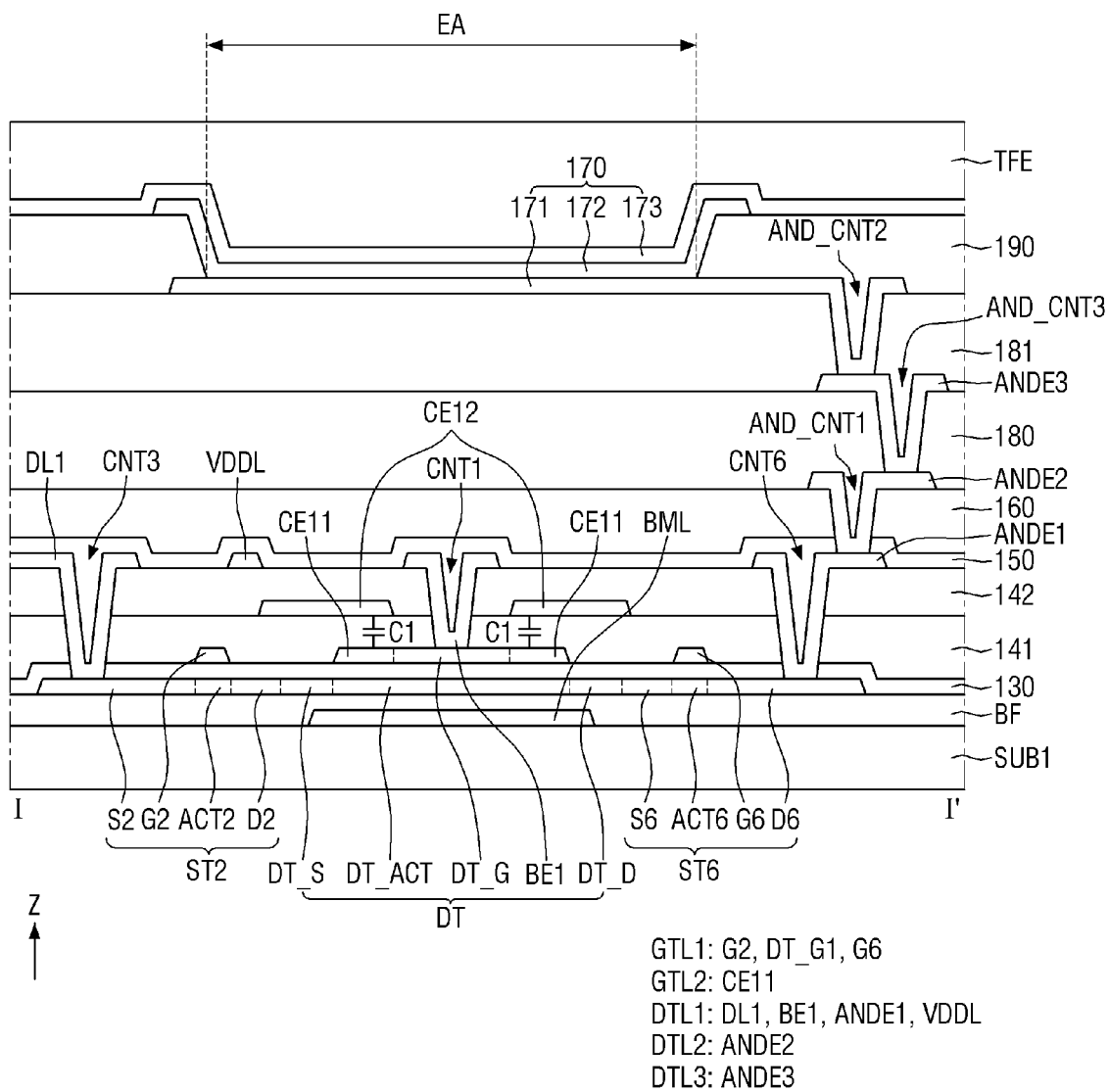
FIGS. 10 and 11 are cross-sectional views taken along lines I-I' and II-II', respectively, of FIG. 7 according to an embodiment.

FIGS. 10 and 11 are cross-sectional views taken along lines I-I' and II-II', respectively, of FIG. 7 according to an embodiment.

In the embodiment of FIGS. 10 and 11, a second source metal layer DTL2 may include a second power supply line VDDL, a third source metal layer DTL3 which may include a third anode connection electrode ANDE3 and a first connecting electrode CE1 may be disposed on a second planarization film 180, and a third planarization film 181 may be disposed on the third source metal layer DTL3.

Referring to FIGS. 10 and 11, the second source metal layer DTL2 may be formed on a first planarization film 160. The second source metal layer DTL2 may include a second anode connection electrode ANDE2 and the second power supply line VDDL. The second source metal layer DTL2 may be formed as a single- or multilayer film including Mo, Al, Cr, Au, Ti, Ni, Nd, Cu, or an alloy thereof.

The second planarization film 180 may be formed on the second source metal layer DTL2. The second planarization film 180 may be formed as an organic film including an acrylic resin, an epoxy resin, a phenolic resin, a polyamide resin, or a polyimide resin.

The third source metal layer DTL3 may be formed on the second planarization film 180. The third source metal layer DTL3 may include the third anode connection electrode ANDE3 and a first connection line CL1. The third source metal layer DTL3 may be formed as a single- or multilayer film including Mo, Al, Cr, Au, Ti, Ni, Nd, Cu, or an alloy thereof.

The third planarization film 181 may be formed on the third source metal layer DTL3. The third planarization film 181 may be formed as an organic film including an acrylic resin, an epoxy resin, a phenolic resin, a polyamide resin, or a polyimide resin.

A second anode contact hole AND_CNT2 may be a hole which exposes the third anode connection electrode ANDE3 through the third planarization film 181. The third anode contact hole AND_CNT3 may be a hole which exposes the second anode connection electrode ANDE2 through the second planarization film 180.

A first connection hole CT1 may be a hole which exposes a first data line DL1 through the first planarization film 160. Second and third connection holes CT2 and CT3 may be holes which expose second and third data lines DL2 and DL3, respectively, through the first planarization film 160.

The first fan-out lines FL1 of FIG. 5 may be alternately disposed in first and second gate metal layers GTL1 and GTL2. The second fan-out lines FL2 of FIG. 5 may be alternately disposed in first and second source metal layers DTL1 and DTL2. A first wire connection hole FCT1 may be a hole that penetrates the first planarization film 160, a passivation film 150, and a second interlayer insulating film 142 or a hole that penetrates the passivation film 150, the second interlayer insulating film 142, and a first interlayer insulating film 141. A second wire connection hole FCT2 may be a hole that penetrates the second planarization film 180.

Figure 12:
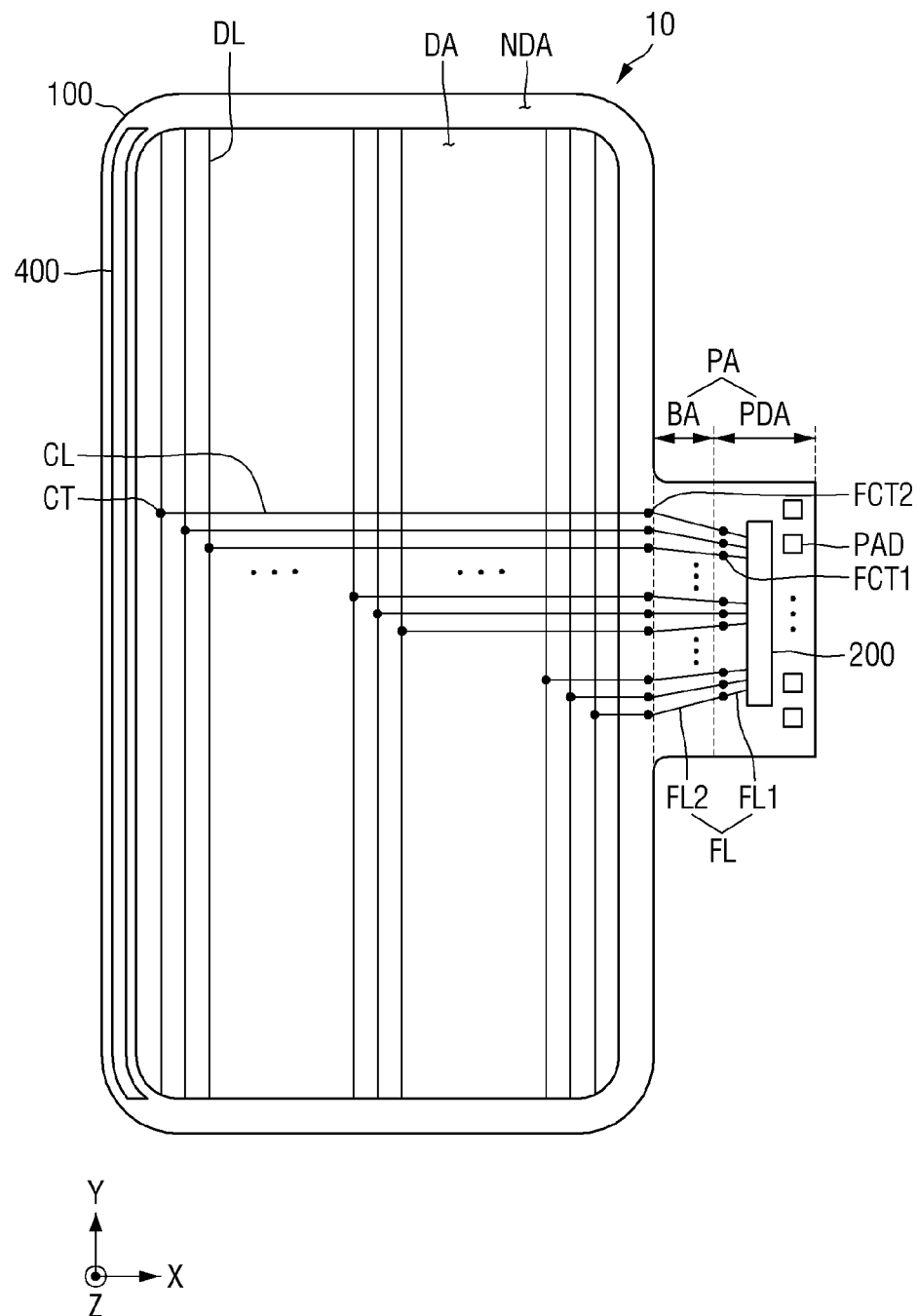
FIG. 12 is a plan view illustrating a display panel, a display driver, and a scan driver of a display device according to another embodiment.

FIG. 12 is a plan view illustrating a display panel, a display driver, and a scan driver of a display device according to another embodiment.

In the embodiment of FIG. 12, a scan driver 400 may be disposed in a portion of a non-display area NDA at the outer left side of a display area DA.

Referring to FIG. 12, if the scan driver 400 may be disposed at the outer right side of the display area DA, the complexity of wiring in a portion of the non-display area NDA at the outer right side of the display area DA may be undesirably high due to the presence of fan-out lines FL and the scan driver 400. On the contrary, if the scan driver 400 may be disposed at the outer left side of the display area DA, the complexity of the wiring in the portion of the non-display area NDA at the outer right side of the display area DA can be reduced due to the absence of the scan driver 400.

Figure 13:
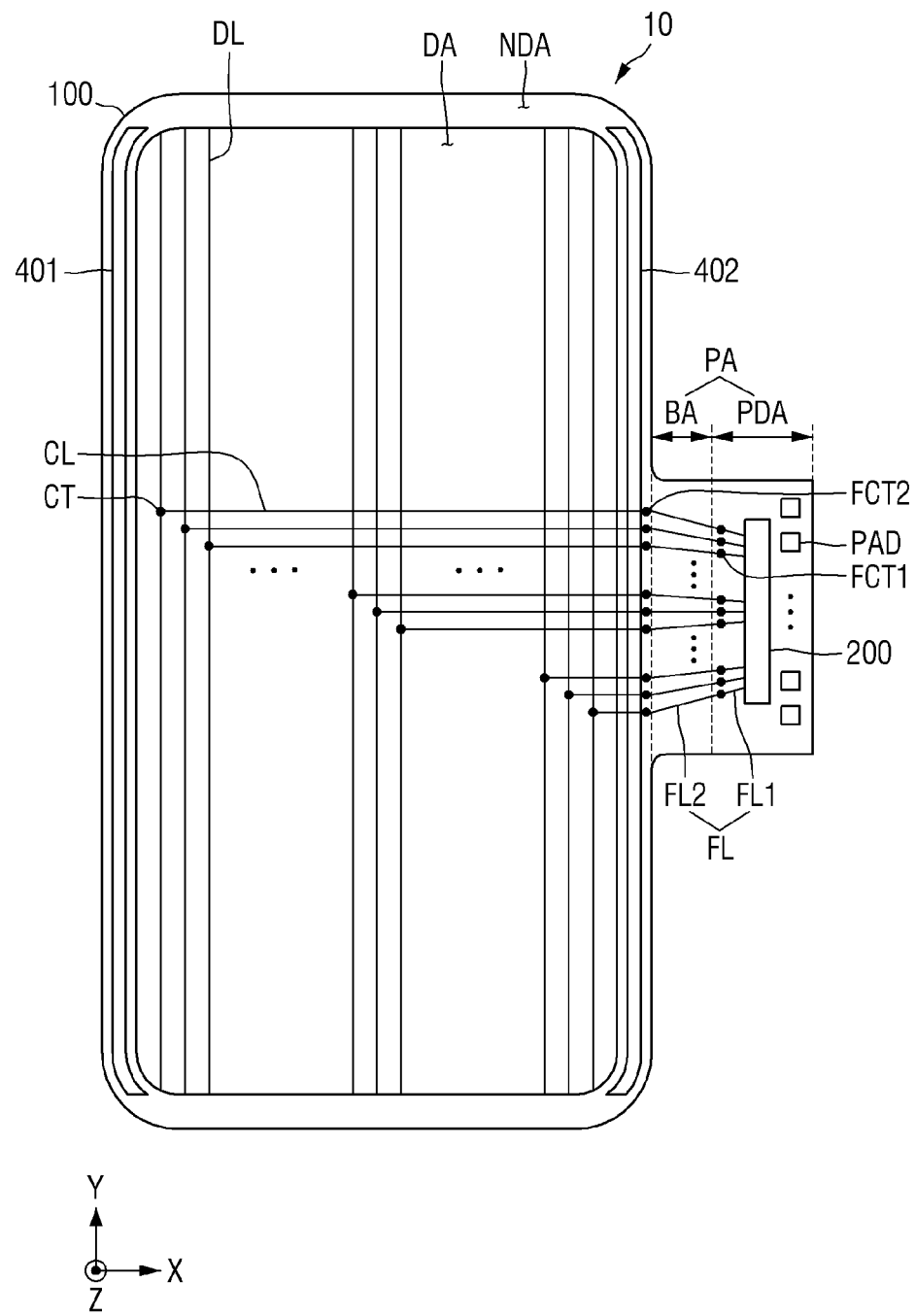
FIG. 13 is a plan view illustrating a display panel, a display driver, and a scan driver of a display device according to another embodiment.

FIG. 13 is a plan view illustrating a display panel, a display driver, and a scan driver of a display device according to another embodiment.

In the embodiment of FIG. 13, there may be provided two scan drivers 401 and 402 disposed in a non-display area NDA, on the outer left and right sides, respectively, of a display area DA.

Referring to FIG. 13, each of the scan drivers 401 and 402 may include a scan signal output portion which may be connected to scan lines and an emission signal output portion which may be connected to emission lines. The scan signal output portion may be disposed in a portion of the non-display area NDA on a first outer side of the display area DA, and the emission signal output portion may be disposed in a portion of the non-display area NDA on a second outer side of the display area DA. The scan signal output portion may be disposed in a portion of the non-display area NDA at the outer left side of the display area DA, and the emission signal output portion may be disposed in a portion of the non-display area NDA at the outer right side of the display area DA. In another example, the scan signal output portion may be disposed in a portion of the non-display area NDA at the outer right side of the display area DA, and the emission signal output portion may be disposed in a portion of the non-display area NDA at the outer left side of the display area DA.

In another example, parts of the scan signal output portion and the emission signal output portion may be disposed in the portion of the non-display area NDA on the first outer side of the display area DA, and the rest of the scan signal output portion and the emission signal output portion may be disposed in the portion of the non-display area NDA on the second outer side of the display area DA. For example, an odd-numbered scan signal output portion which may be connected to odd-numbered scan lines may be disposed in the portion of the non-display area NDA on the first outer side of the display area DA, and an even-numbered scan signal output portion which may be connected to even-numbered scan lines may be disposed in the portion of the non-display area NDA on the second outer side of the display area DA.

Figure 14:
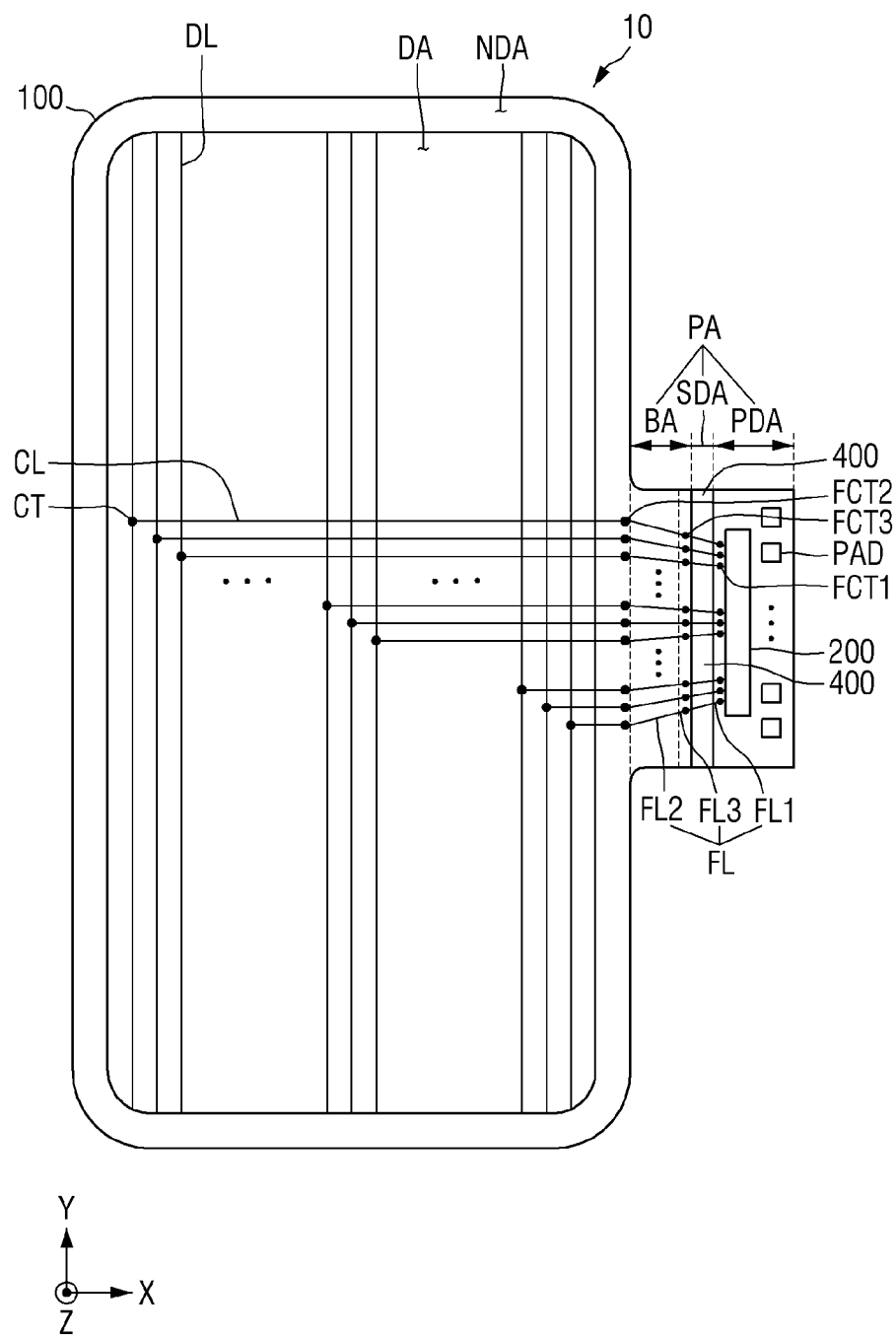
FIG. 14 is a plan view illustrating a display panel, a display driver, and a scan driver of a display device according to another embodiment.

FIG. 14 is a plan view illustrating a display panel, a display driver, and a scan driver of a display device according to another embodiment.

In the embodiment of FIG. 14, a scan driver 400 may be disposed in a pad area PA, rather than in a non-display area NDA.

Referring to FIG. 14, the pad area PA may include a bending area BA, a first sub-pad area PDA, and a second sub-pad area SDA. The second sub-pad area SDA may be disposed between the bending area BA and the first sub-pad area PDA. The scan driver 400 may be disposed in the second sub-pad area SDA.

Fan-out lines FL may be disposed in the bending area BA and the first sub-pad area PDA. Fan-out lines FL may include first fan-out lines FL1, second fan-out lines FL2, and third fan-out lines FL3. The first fan-out lines FL1 may be disposed in the first sub-pad area PDA and may be connected to a display driver 200. The first fan-out lines FL1 may be connected to the third fan-out lines FL3 through first wire connection holes FCT1, in a portion of the first sub-pad area PDA adjacent to the second sub-pad area SDA. The third fan-out lines FL3 may be disposed in the second sub-pad area SDA. The third fan-out lines FL3 may be connected to the second fan-out lines FL2 via third wire connection holes FCT3 in a portion of the second sub-pad area SDA adjacent to the bending area BA. The second fan-out lines FL2 may be disposed in the bending area BA. The second fan-out lines FL2 may be connected to connection lines CL via second wire connection holes FCT2, in the non-display area NDA.

The first fan-out lines FL1 may be alternately disposed in first and second gate metal layers GTL1 and GTL2. The third fan-out lines FL3 may be disposed in a second source metal layer DTL2. In another example, the third fan-out lines FL3 may be alternately disposed in the second source metal layer DTL2 and a third source metal layer DTL3. The second fan-out lines FL2 may be alternately disposed in a first source metal layer DTL1 and the second source metal layer DTL2. In this case, the first wire connection holes FCT1 may be holes that penetrate a second planarization film 180, a first planarization film 160, a passivation film 150, and a second interlayer insulating film 142 or holes that penetrate the first planarization film 160, the passivation film 150, the second interlayer insulating film 142, and a first interlayer insulating film 141. Also, the third wire connection holes FCT3 may be holes that penetrate the first planarization film 160 or holes that penetrate the second planarization film 180. Also, the second wire connection holes FCT2 may not be provided, and the second fan-out lines FL2 may be disposed in the same layer as, and connected (or directly connected) to the connection lines CL. Also, the second wire connection holes FCT2 may be holes that penetrate the second planarization film 180.

According to the embodiment of FIG. 14, since the scan driver 400 may be disposed in the pad area PA, rather than in the non-display area NDA, the difference between the widths of parts of the non-display area NDA on the outer left and right sides of the display area DA can be minimized.

Figure 15:
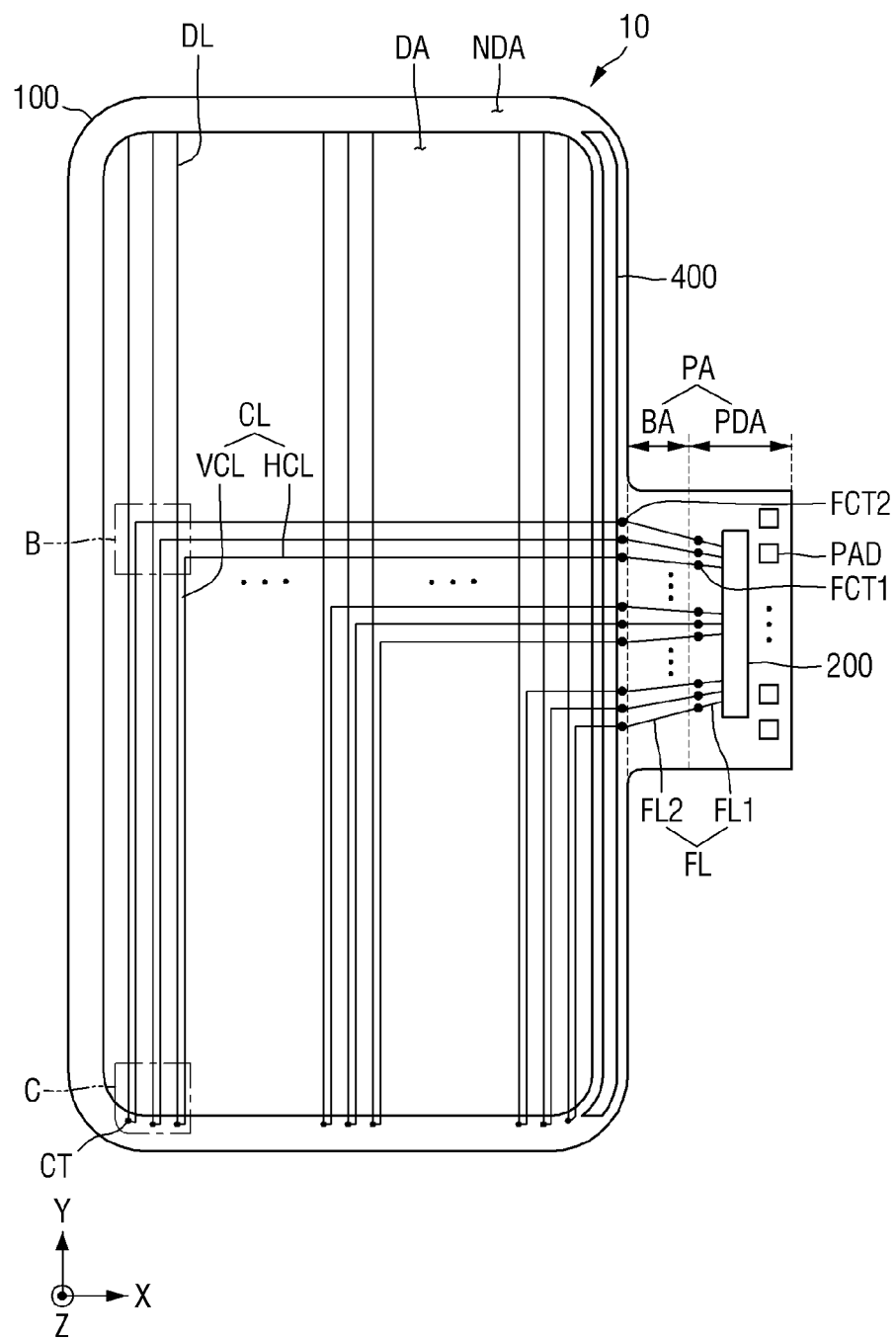
FIG. 15 is a plan view illustrating a display panel, a display driver, and a scan driver of a display device according to another embodiment.

FIG. 15 is a plan view illustrating a display panel, a display driver, and a scan driver of a display device according to another embodiment.

In the embodiment of FIG. 15, connection lines CL may be connected to data lines DL, in a non-display area NDA, rather than in a display area DA.

Referring to FIG. 15, the connection lines CL may include horizontal connection lines HCL which extend in a first direction (or an X-axis direction) and vertical connection lines VCL which extend in a second direction (or a Y-axis direction).

In the non-display area NDA, the horizontal connection lines HCL may be connected to second fan-out lines FL2 through second wire connection holes FCT2. The vertical connection lines VCL may be connected to data lines DL through connection holes CT. The data lines DL may be connected to the vertical connection lines VCL through the connection holes CT. The vertical connection lines VCL may be connected one-to-one to the data lines DL.

In the non-display area NDA, the vertical connection lines VCL may be connected to the data lines DL through the connection holes CT. That is, the connection holes CT may be disposed in the non-display area NDA. FIG. 15 illustrates that the vertical connection lines VCL may be disposed in a portion of the non-display area NDA on the outer lower side of the display area DA, but the embodiments are not limited thereto. For example, the vertical connection lines VCL may be disposed in a portion of the non-display area NDA on the outer upper side of the display area DA.

According to the embodiment of FIG. 15, the pad area PA in which a display driver 200 may be disposed may protrude from the non-display area NDA in the first direction (or the X-axis direction), which intersects a direction in which the data lines DL extend, i.e., a second direction (or a Y-axis direction). Thus, the data lines DL, which extend in the second direction (or the Y-axis direction), may receive data voltages from the display driver 200 via the horizontal connection lines HCL, which extend in the first direction (or the X-axis direction), and the vertical connection lines VCL, which extend in the second direction (or the Y-axis direction).

Also, according to the embodiment of FIG. 15, where the pad area PA protrudes from the non-display area NDA in the first direction (or the X-axis direction), the length, in the second direction (or the Y-axis direction), of the pad area PA may be greater than the length, in the first direction (or the X-axis direction), of the pad area PA. The design and/or arrangement of fan-out lines FL which connect the display area DA and the pad area PA can be facilitated. Accordingly, the difference between the widths of parts of the non-display area NDA on the outer left and right sides of the display area DA can be minimized.

Figure 16:
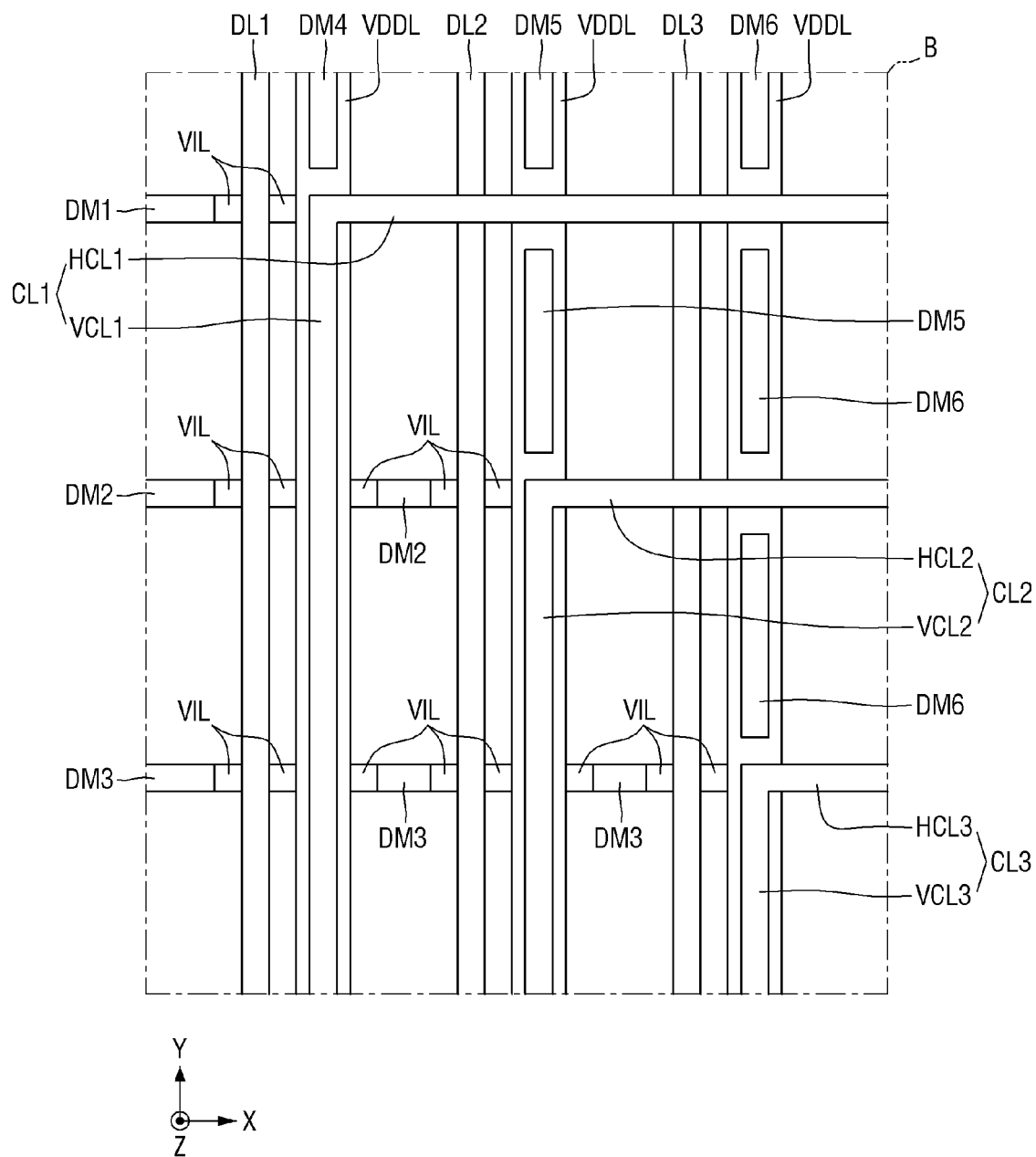
FIG. 16 is an enlarged plan view illustrating area B of FIG. 15.
Figure 17:
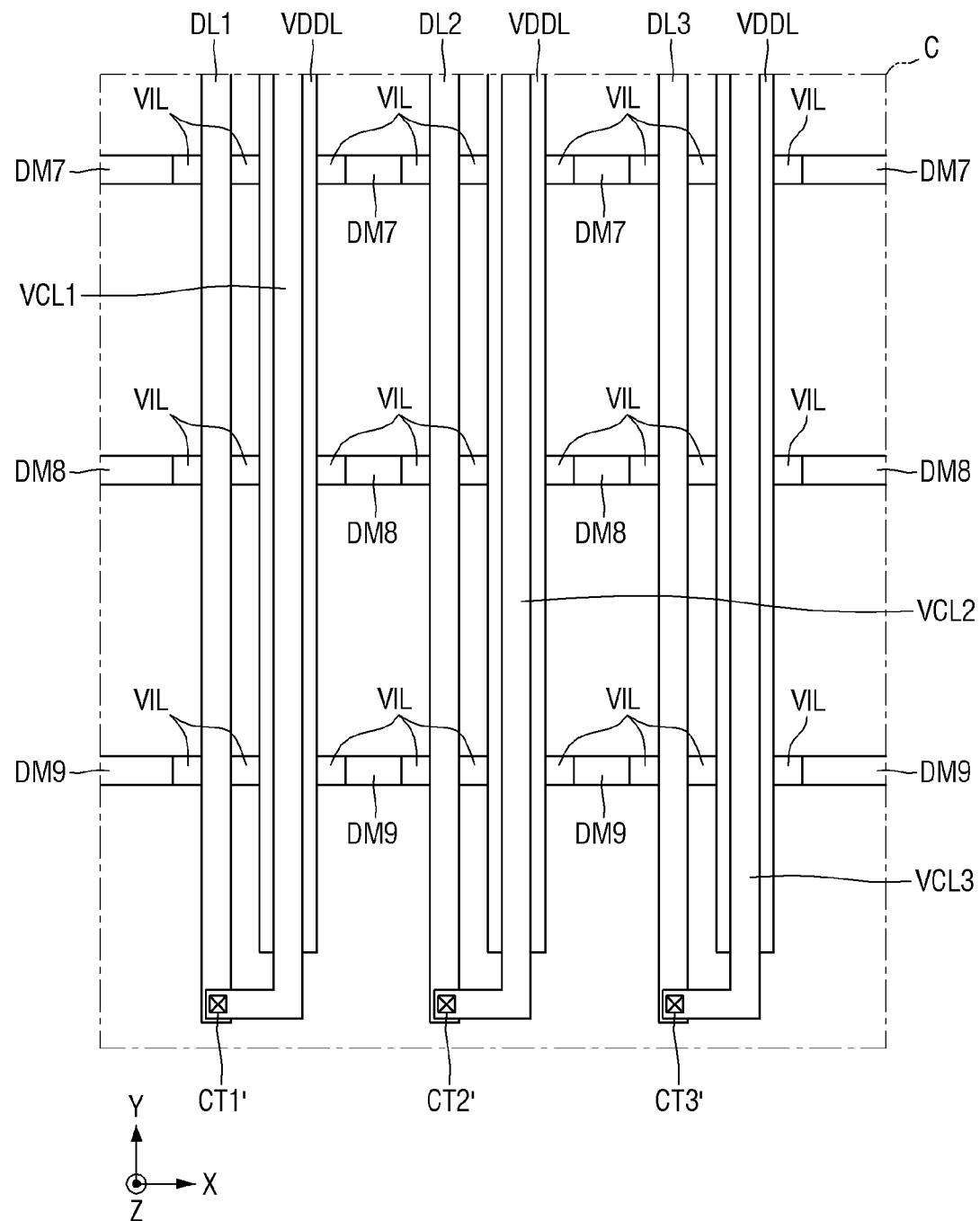
FIG. 17 is an enlarged plan view illustrating area C of FIG. 15.

FIG. 16 is an enlarged plan view illustrating area B of FIG. 15. FIG. 17 is an enlarged plan view illustrating area C of FIG. 15. Specifically, FIGS. 16 and 17 illustrate first, second, and third connection lines CL1, CL2, and CL3 which may be connected to first, second, and third data lines DL1, DL2, and DL3, respectively.

In the embodiment of FIGS. 16 and 17, each of the first, second, and third connection lines CL1, CL2, and CL3 includes a horizontal connection line and a vertical connection line.

Referring to FIGS. 16 and 17, the first connection line CL1 includes first and second sub-connection lines HCL1 and VCL1. The second connection line CL2 includes second horizontal and vertical connection lines HCL2 and VCL2. The third connection line CL3 includes third horizontal and vertical connection lines HCL3 and VCL3.

The first sub-connection line HCL1, the second horizontal connection line HCL2, and the third horizontal connection line HCL3 may extend in a first direction (or an X-axis direction). The second sub-connection line VCL1, the second vertical connection line VCL2, and the third vertical connection line VCL3 may extend in a second direction (or a Y-axis direction).

The first sub-connection line HCL1, the second horizontal connection line HCL2, and the third horizontal connection line HCL3 may overlap first power supply lines VIL in a third direction (or a Z-axis direction). The second sub-connection line VCL1, the second vertical connection line VCL2, and the third vertical connection line VCL3 may overlap second power supply lines VDDL in the third direction (or the Z-axis direction).

The first sub-connection line HCL1 may be connected to the second sub-connection line VCL1 in the overlapping area of the first sub-connection line HCL1 and a second power supply line VDDL. The first and second sub-connection lines HCL1 and VCL1 may be disposed in the same layer. In a non-display area NDA, the second sub-connection line VCL1 may be bent in the first direction (or the X-axis direction) and may be connected to the first data line DL1 through a first connection hole CT1'. That is, in a display area DA, the first connection line CL1 may extend in the first direction (or the X-axis direction) and may be bent to extend in the second direction (or the Y-axis direction), and in the non-display area NDA, the first connection line CL1 may be bent again to extend back in the first direction (or the X-axis direction).

The second horizontal connection line HCL2 may be connected to the second vertical connection line VCL2 in the overlapping area of the second horizontal connection line HCL2 and a second power supply line VDDL. The second horizontal and vertical connection lines HCL2 and VCL2 may be disposed in the same layer. In the non-display area NDA, the second vertical connection line VCL2 may be bent in the first direction (or the X-axis direction) and may be connected to the second data line DL2 through a second connection hole CT2'. That is, in the display area DA, the second connection line CL2 may extend in the first direction (or the X-axis direction) and may be bent to extend in the second direction (or the Y-axis direction), and in the non-display area NDA, the second connection line CL2 may be bent again to extend back in the first direction (or the X-axis direction).

The third horizontal connection line HCL3 may be connected to the third vertical connection line VCL3 in the overlapping area of the third horizontal connection line HCL3 and a second power supply line VDDL. The third horizontal and vertical connection lines HCL3 and VCL3 may be disposed in the same layer. In the non-display area NDA, the third vertical connection line VCL3 may be bent in the first direction (or the X-axis direction) and may be connected to the third data line DL3 through a third connection hole CT3'. That is, in the display area DA, the third connection line CL3 may extend in the first direction (or the X-axis direction) and may be bent to extend in the second direction (or the Y-axis direction), and in the non-display area NDA, the third connection line CL3 may be bent again to extend back in the first direction (or the X-axis direction).

A first dummy pattern DM1 may be spaced apart in the first direction (or the X-axis direction) from the first sub-connection line HCL1 and may overlap, in the third direction (or the Z-axis direction), with the first power supply line VIL that may overlap the first sub-connection line HCL1. Second dummy patterns DM2 may be spaced apart in the first direction (or the X-axis direction) from the second connection line CL2 and may overlap, in the third direction (or the Z-axis direction), with the first power supply line VIL that may overlap the second horizontal connection line HCL2. One of the second dummy patterns DM2 may be disposed on the left side of the second sub-connection line VCL1, and another one of the second dummy patterns DM2 may be disposed on the right side of the second sub-connection line VCL1. Third dummy patterns DM3 may be spaced apart in the first direction (or the X-axis direction) from the third connection line CL3 and may overlap, in the third direction (or the Z-axis direction), with the first power supply line VIL that may overlap the third horizontal connection line HCL3. One of the third dummy patterns DM3 may be disposed on the left side of the second sub-connection line VCL1, another one of the third dummy pattern DM3 may be disposed between the second sub-connection line VCL1 and the second vertical connection line VCL2, and yet another one of the third dummy patterns DM3 may be disposed on the right side of the second vertical connection line VCL2.

A fourth dummy pattern DM4 may be spaced apart in the second direction (or the Y-axis direction) from the second sub-connection line VCL1 and may overlap, in the third direction (or the Z-axis direction), with the second power supply line VDDL that may overlap the second sub-connection line VCL1. Fifth dummy patterns DM5 may be spaced apart from the second vertical connection line VCL2 in the second direction (or the Y-axis direction) and may overlap, in the third direction (or the Z-axis direction), with the second power supply line VDDL that may overlap the second vertical connection line VCL2. One of the fifth dummy patterns DM5 may be disposed on the upper side of the first sub-connection line HCL1, and another one of the fifth dummy patterns DM5 may be disposed on the lower side of the first sub-connection line HCL1. Sixth dummy patterns DM6 may be spaced apart from the third vertical connection line VCL3 in the second direction (or the Y-axis direction) and may overlap, in the third direction (or the Z-axis direction), with the second power supply line VDDL that may overlap the third vertical connection line VCL3. One of the sixth dummy patterns DM6 may be disposed on the upper side of the first sub-connection line HCL1, another one of the sixth dummy patterns DM6 may be disposed between the first sub-connection line HCL1 and the second horizontal connection line HCL2, and yet another one of the sixth dummy patterns DM6 may be disposed on the lower side of the second horizontal connection line HCL2.

Seventh dummy patterns DM7 may overlap one of the first power supply lines VIL. One of the seventh dummy patterns DM7 may be disposed on the left side of the second sub-connection line VCL1, another one of the seventh dummy patterns DM7 may be disposed between the second sub-connection line VCL1 and the second vertical connection line VCL2, yet another one of the seventh dummy patterns DM7 may be disposed between the second vertical connection line VCL2 and the third vertical connection line VCL3, and yet still another one of the seventh dummy patterns DM7 may be disposed on the right side of the third vertical connection line VCL3. Eighth dummy patterns DM8 may overlap a first power supply line VIL below (or directly below) the first power supply line VIL that may overlap the seventh dummy patterns DM7. One of the eighth dummy patterns DM8 may be disposed on the left side of the second sub-connection line VCL1, another one of the eighth dummy patterns DM8 may be disposed between the second sub-connection line VCL1 and the second vertical connection line VCL2, yet another one of the eighth dummy patterns DM8 may be disposed between the second vertical connection line VCL2 and the third vertical connection line VCL3, and yet still another one of the eighth dummy patterns DM8 may be disposed on the right side of the third vertical connection line VCL3. Ninth dummy patterns DM9 may overlap a first power supply line VIL below (or directly below) the first power supply line VIL that may overlap the eighth dummy patterns DM8. One of the ninth dummy patterns DM9 may be disposed on the left side of the second sub-connection line VCL1, another one of the ninth dummy patterns DM9 may be disposed between the second sub-connection line VCL1 and the second vertical connection line VCL2, yet another one of the ninth dummy patterns DM9 may be disposed between the second vertical connection line VCL2 and the third vertical connection line VCL3, and yet still another one of the ninth dummy patterns DM9 may be disposed on the right side of the third vertical connection line VCL3.

The first dummy pattern DM1, the second dummy patterns DM2, the third dummy patterns DM3, the fourth dummy pattern DM4, the fifth dummy patterns DM5, the sixth dummy patterns DM6, the seventh dummy patterns DM7, the eighth dummy patterns DM8, and the ninth dummy patterns DM9 may be formed as islands and may be electrically floated. That is, no particular voltage may be applied to the first dummy pattern DM1, the second dummy patterns DM2, the third dummy patterns DM3, the fourth dummy pattern DM4, the fifth dummy patterns DM5, the sixth dummy patterns DM6, the seventh dummy patterns DM7, the eighth dummy patterns DM8, and the ninth dummy patterns DM9.

Where the first dummy pattern DM1, the second dummy patterns DM2, the third dummy patterns DM3, the fourth dummy pattern DM4, the fifth dummy patterns DM5, the sixth dummy patterns DM6, the seventh dummy patterns DM7, the eighth dummy patterns DM8, and the ninth dummy patterns DM9 may not be formed, the amount of external light reflected in regions where the first, second and third connection lines CL1, CL2, and CL3 may be disposed differs from the amount of external light reflected in regions where the first, second and third connection lines CL1, CL2, and CL3 may not be disposed, and thus, the connection lines CL1, CL2, and CL3 may be visible to a user. However, if the first dummy pattern DM1, the second dummy patterns DM2, the third dummy patterns DM3, the fourth dummy pattern DM4, the fifth dummy patterns DM5, the sixth dummy patterns DM6, the seventh dummy patterns DM7, the eighth dummy patterns DM8, and the ninth dummy patterns DM9 may be provided in the regions where the first, second, and third connection lines CL1, CL2, and CL3 may not be disposed, the first, second and third connection lines CL1, CL2, and CL3 can be prevented from becoming visible to the user because the amount of external light reflected in the regions where the first, second and third connection lines CL1, CL2, and CL3 may be disposed may not considerably differ from the amount of external light reflected in the regions where the first, second and third connection lines CL1, CL2, and CL3 may not be disposed.

According to the embodiment of FIGS. 16 and 17, the first, second, and third connection lines CL1, CL2, and CL3 may be connected to the first, second, and third data lines DL1, DL2, and DL3, respectively, through the first, second, and third connection holes CT1', CT2', and CT3', respectively. Therefore, the first, second, and third data lines DL1, DL2, and DL3, which extend in the second direction (or the Y-axis direction), can receive data voltages from the display driver 200 via the horizontal connection lines HCL1, HCL2, and HCL3, which extend in the first direction (or the X-axis direction), and the vertical connection lines VCL1, VCL2, and VCL3, which extend in the second direction (or the Y-axis direction).

Figure 18:
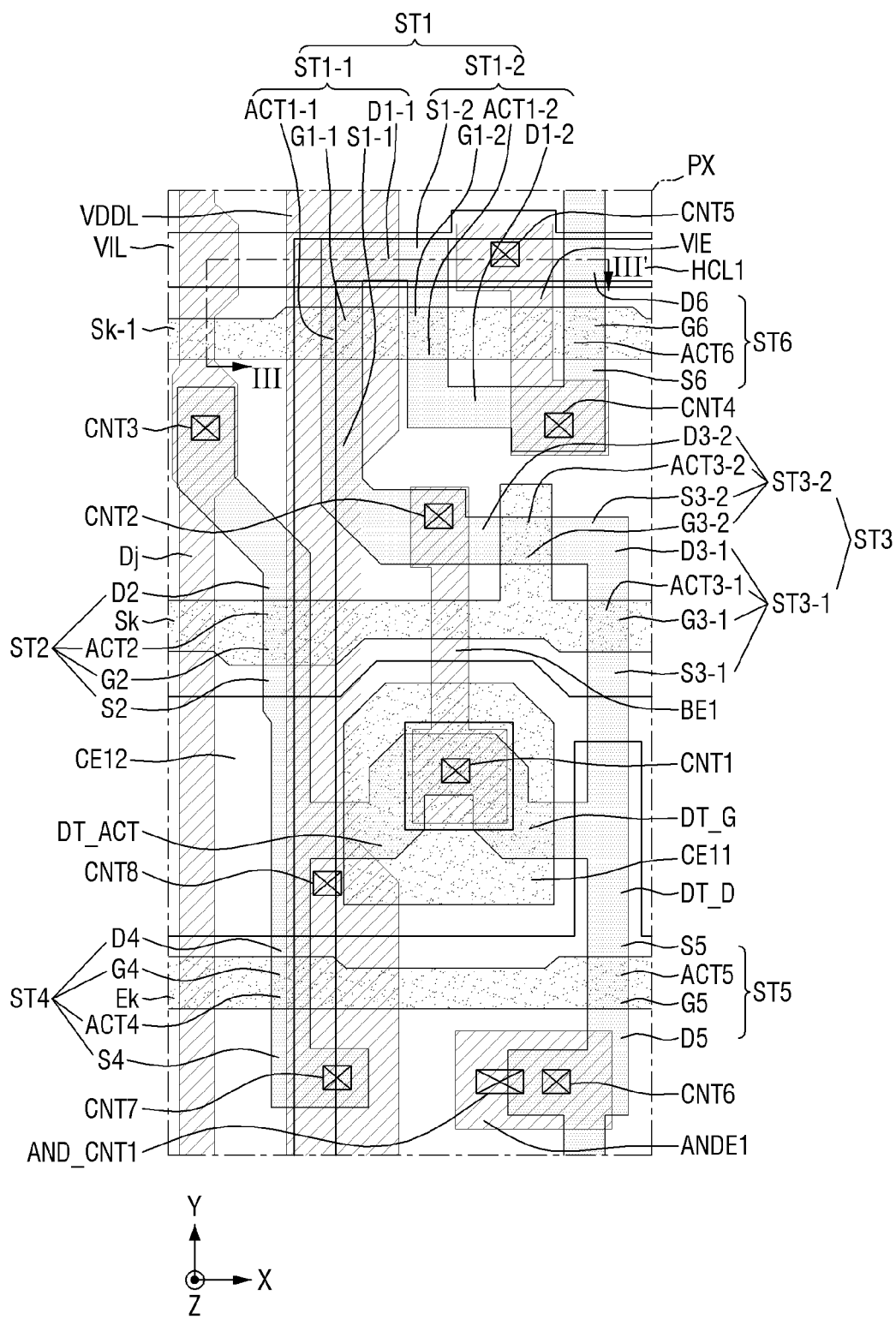
FIG. 18 is an enlarged plan view illustrating a subpixel overlapping a first data line, a first sub-connection line, and a second sub-connection line of FIG. 16.
Figure 19:
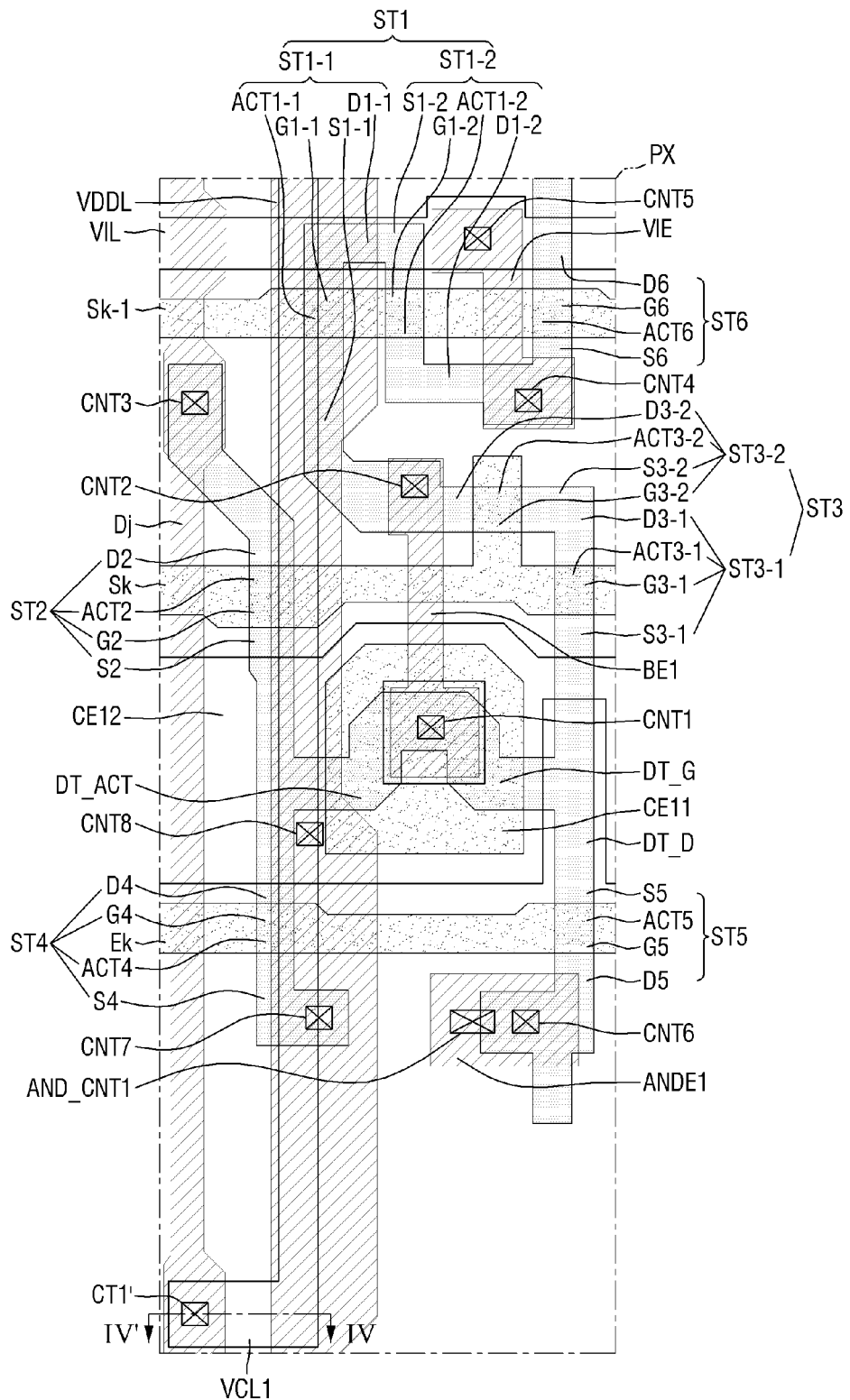
FIG. 19 is an enlarged plan view illustrating a subpixel overlapping a first data line and a second sub-connection line of FIG. 17.

FIG. 18 is an enlarged plan view illustrating a subpixel overlapping a first data line, a first sub-connection line, and a second sub-connection line of FIG. 16. FIG. 19 is an enlarged plan view illustrating a subpixel overlapping a first data line and a second sub-connection line of FIG. 17.

In the embodiment of FIGS. 18 and 19, a first connection line CL1 includes first and second sub-connection lines HCL1 and VCL1.

Referring to FIGS. 18 and 19, the first sub-connection line HCL1 may overlap a first power supply line VIL in the third direction (or the Z-axis direction). The first sub-connection line HCL1 may overlap a second electrode D1-1 of a (1-1)-th transistor ST1-1 and a first electrode S1-2 of a (1-2)-th transistor ST1-2. The first sub-connection line HCL1 may overlap a second connecting electrode VIE and a second electrode D5 of a fifth transistor ST5. The first sub-connection line HCL1 may overlap a fifth contact hole CT5. The first power supply line VIL may be disposed between the first sub-connection line HCL1 and the second electrode D1-1 of the (1-1)-th transistor ST1-1, between the first sub-connection line HCL1 and the first electrode S1-2 of the (1-2)-th transistor ST1-2, and between the first sub-connection line HCL1 and the second electrode D5 of the fifth transistor ST5. Due to the presence of the first power supply line VIL, the occurrence of coupling between the first sub-connection line HCL1 and the second electrode D1-1 of the (1-1)-th transistor ST1-1, between the first sub-connection line HCL1 and the first electrode S1-2 of the (1-2)-th transistor ST1-2, and between the first sub-connection line HCL1 and the second electrode D5 of the fifth transistor ST5 can be prevented. Accordingly, the influence of the first sub-connection line HCL1 on the second electrode D1-1 of the (1-1)-th transistor ST1-1, the first electrode S1-2 of the (1-2)-th transistor ST1-2, and the second electrode D5 of the fifth transistor ST5 can be reduced or minimized.

The second sub-connection line VCL1 may overlap a second power supply line VDDL in the third direction (or the Z-axis direction). The second sub-connection line VCL1 may overlap an active layer ACT1-1, a gate electrode G1-1, and a first electrode S1-1 of the (1-1)-th transistor ST1-1, an active layer ACT2, a gate electrode G2, a first electrode S2, and a second electrode D2 of a second transistor ST2, and an active layer ACT4, a gate electrode G4, a first electrode S4, and a second electrode D4 of a fourth transistor ST4. The second power supply line VDDL may be disposed between the second sub-connection line VCL1 and the (1-1)-th transistor ST1-1, between the second sub-connection line VCL1 and the second transistor ST2, and between the second sub-connection line VCL1 and the fourth transistor ST4. Due to the presence of the second power supply line VDDL, the occurrence of coupling between the second sub-connection line VCL1 and the (1-1)-th transistor ST1-1, between the second sub-connection line VCL1 and the second transistor ST2, and between the second sub-connection line VCL1 and the fourth transistor ST4 can be prevented. Accordingly, the influence of the second sub-connection line VCL1 on the active layer ACT1-1, the gate electrode G1-1, and the first electrode S1-1 of the (1-1)-th transistor ST1-1, the active layer ACT2, the gate electrode G2, the first electrode S2, and the second electrode D2 of the second transistor ST2, and the active layer ACT4, the gate electrode G4, the first electrode S4, and the second electrode D4 of the fourth transistor ST4 can be reduced or minimized.

Figure 20:
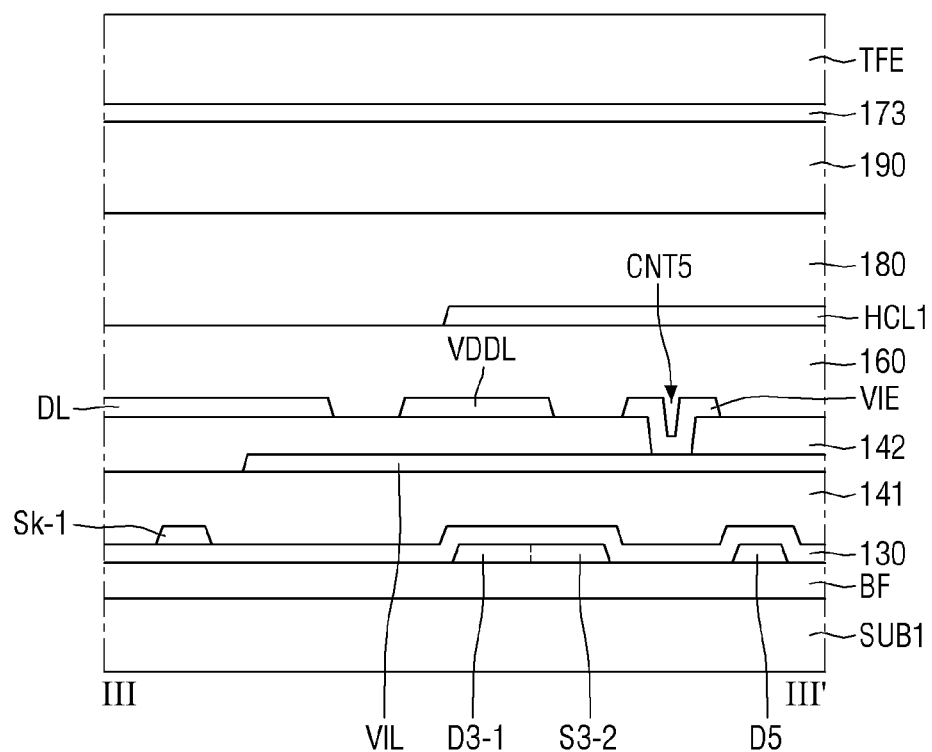
FIGS. 20 and 21 are cross-sectional views taken along lines III-III' and IV-IV', respectively, of FIGS. 18 and 19, respectively, according to an embodiment.
Figure 21:
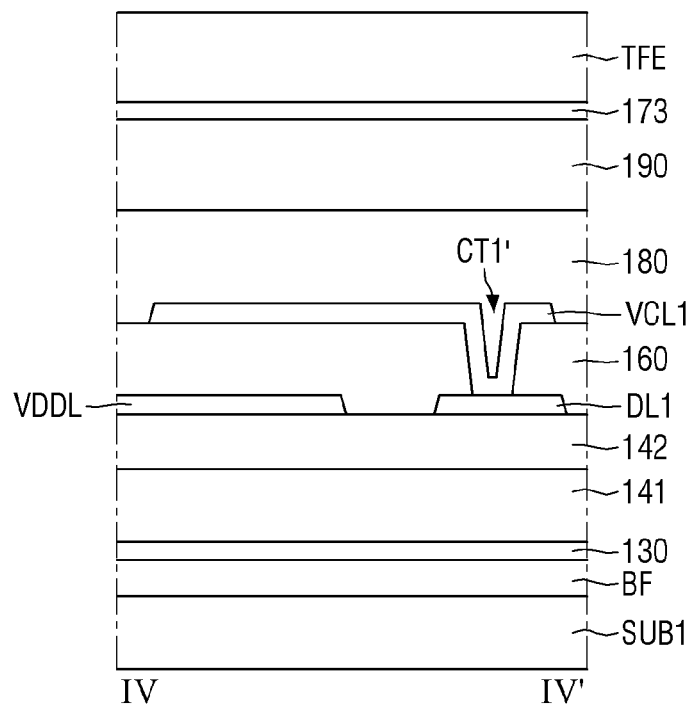

FIGS. 20 and 21 are cross-sectional views taken along lines III-III' and IV-IV', respectively, of FIGS. 18 and 19, respectively.

In the embodiment of FIGS. 20 and 21, a first connection line CL1 includes first and second sub-connection lines HCL1 and VCL1.

Referring to FIGS. 20 and 21, the first and second sub-connection lines HCL1 and VCL1 may be formed of a second source metal layer DTL2. A first connection hole CT1' may be a hole which exposes a first data line DL1 through a first planarization film 160. The second sub-connection line VCL1 may be connected to the first data line DL1 via the first connection hole CT1'.

Figure 22:
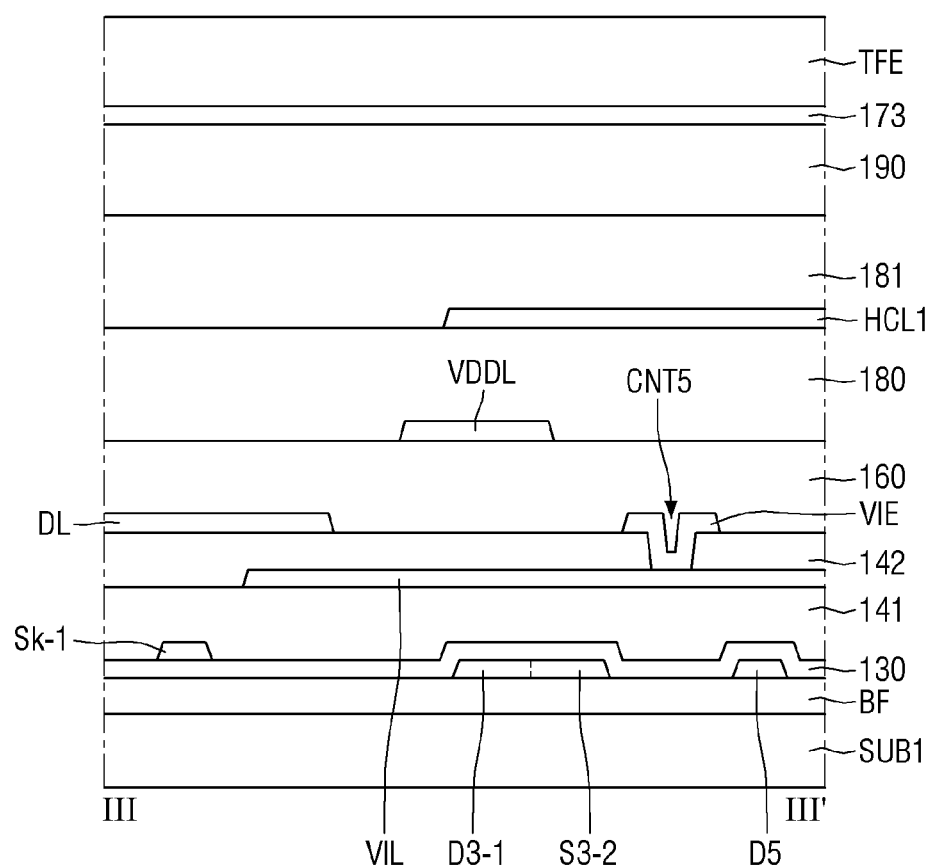
FIGS. 22 and 23 are cross-sectional views taken along lines III-III' and IV-IV', respectively, of FIGS. 18 and 19, respectively, according to an embodiment.
Figure 23:
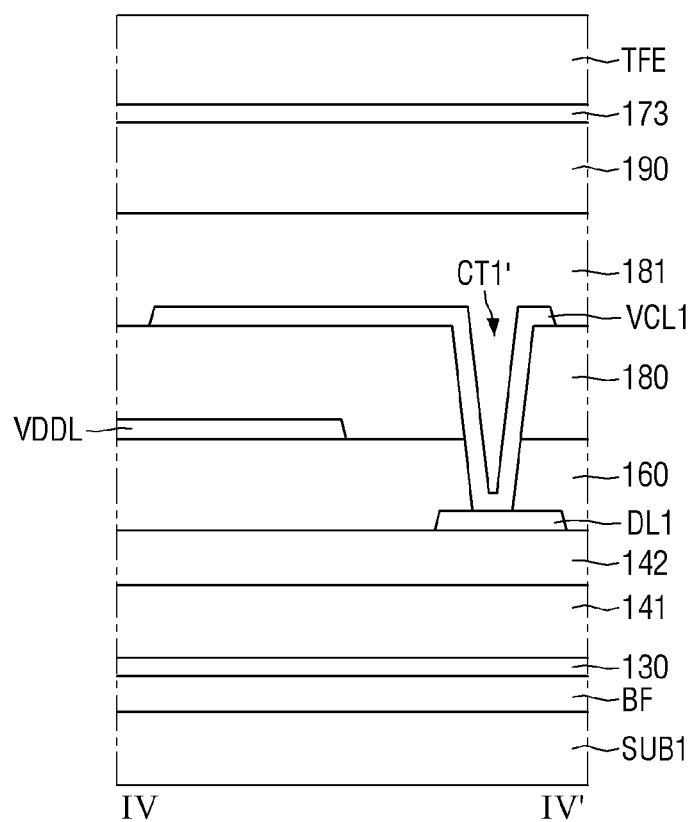

FIGS. 22 and 23 are cross-sectional views taken along lines III-III' and IV-IV', respectively, of FIGS. 18 and 19, respectively.

In the embodiment of FIGS. 22 and 23, a first connection line CL1 includes first and second sub-connection lines HCL1 and VCL1.

Referring to FIGS. 22 and 23, the first and second sub-connection lines HCL1 and VCL1 may be formed of a third source metal layer DTL3. A second power supply line VDDL may be formed of a second source metal layer DTL2. A first connection hole CT1' may be a hole which exposes a first data line DL1 through first and second planarization films 160 and 180. The second sub-connection line VCL1 may be connected to the first data line DL1 via the first connection hole CT1'.

Figure 24:
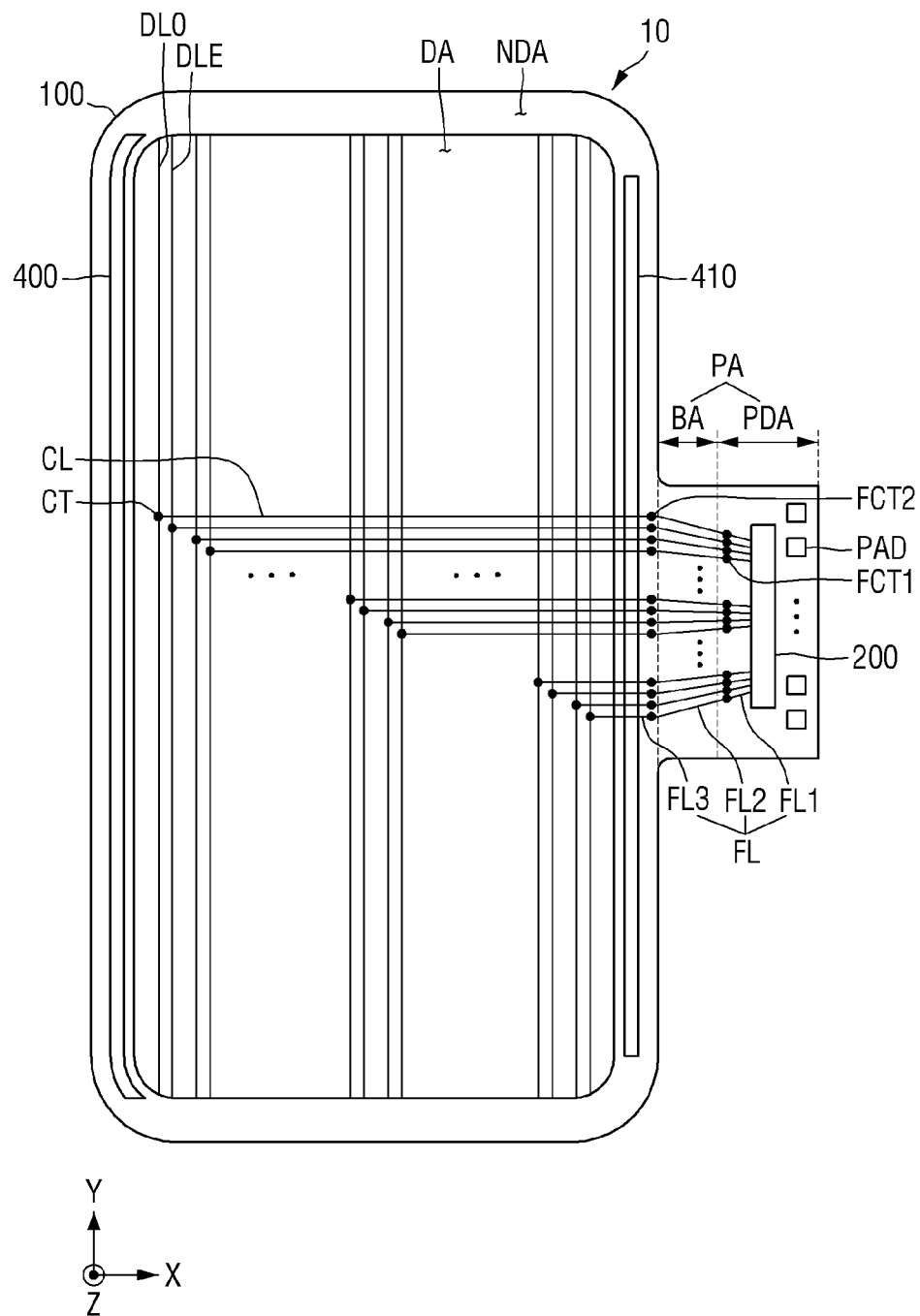
FIG. 24 is a plan view illustrating a display panel, a display driver, and a scan driver of a display device according to another embodiment.

FIG. 24 is a plan view illustrating a display panel, a display driver, and a scan driver of a display device according to another embodiment.

In the embodiment of FIG. 24, data lines may be provided in pairs so that each subpixel overlaps a pair of data lines DLO and DLE, and that a display device 10 further includes a demultiplexer 410.

Referring to FIG. 24, odd-numbered data lines DLO and even-numbered data lines DLE may be connected to connection lines CL via connection holes CT. The odd-numbered data lines DLO and the even-numbered data lines DLE may extend in a second direction (or an X-axis direction). The odd-numbered data lines DLO may be disposed adjacent to the respective even-numbered data lines DLE in a first direction (or an X-axis direction). For example, a first odd-numbered data line and a first even-numbered data line may be disposed adjacent to each other in the first direction (or the X-axis direction), and a second odd-numbered data line and a second even-numbered data line may be disposed adjacent to each other in the first direction (or the X-axis direction). The distance, in the first direction (or the X-axis direction), between the first odd-numbered data line and the first even-numbered data line may be smaller than the distance, in the first direction (or the X-axis direction), between the first even-numbered data line and the second odd-numbered data line.

A scan driver 400 may be disposed in a portion of a non-display area NDA at the outer left side of a display area DA. The demultiplexer 410 may be disposed in a portion of the non-display area NDA at the outer right side of the display area DA. The area of the demultiplexer 410 may be smaller than the area of the scan driver 400, and as a result, the length, in a second direction (or a Y-axis direction), of the demultiplexer 410 may be smaller than the length, in the second direction (or the Y-axis direction), of the scan driver 400.

The demultiplexer 410 may distribute data voltages applied to each fan-out line FL between connection lines CL. The number of fan-out lines FL connected to the demultiplexer 410 may be smaller than the number of connection lines CL connected to the demultiplexer 410. Since the number of fan-out lines FL disposed in a pad area PA can be reduced by half or more, the distance between the fan-out lines FL can be widened. That is, the complexity of wiring in the pad area PA can be reduced.

Third fan-out lines FL3 may be disposed in a portion of the non-display area NDA at the outer right side of the display area DA. In the portion of the non-display area NDA at the outer right side of the display area DA, the third fan-out lines FL3 may be connected to second fan-out lines FL2 via second wire connection holes FCT2.

Figure 25:
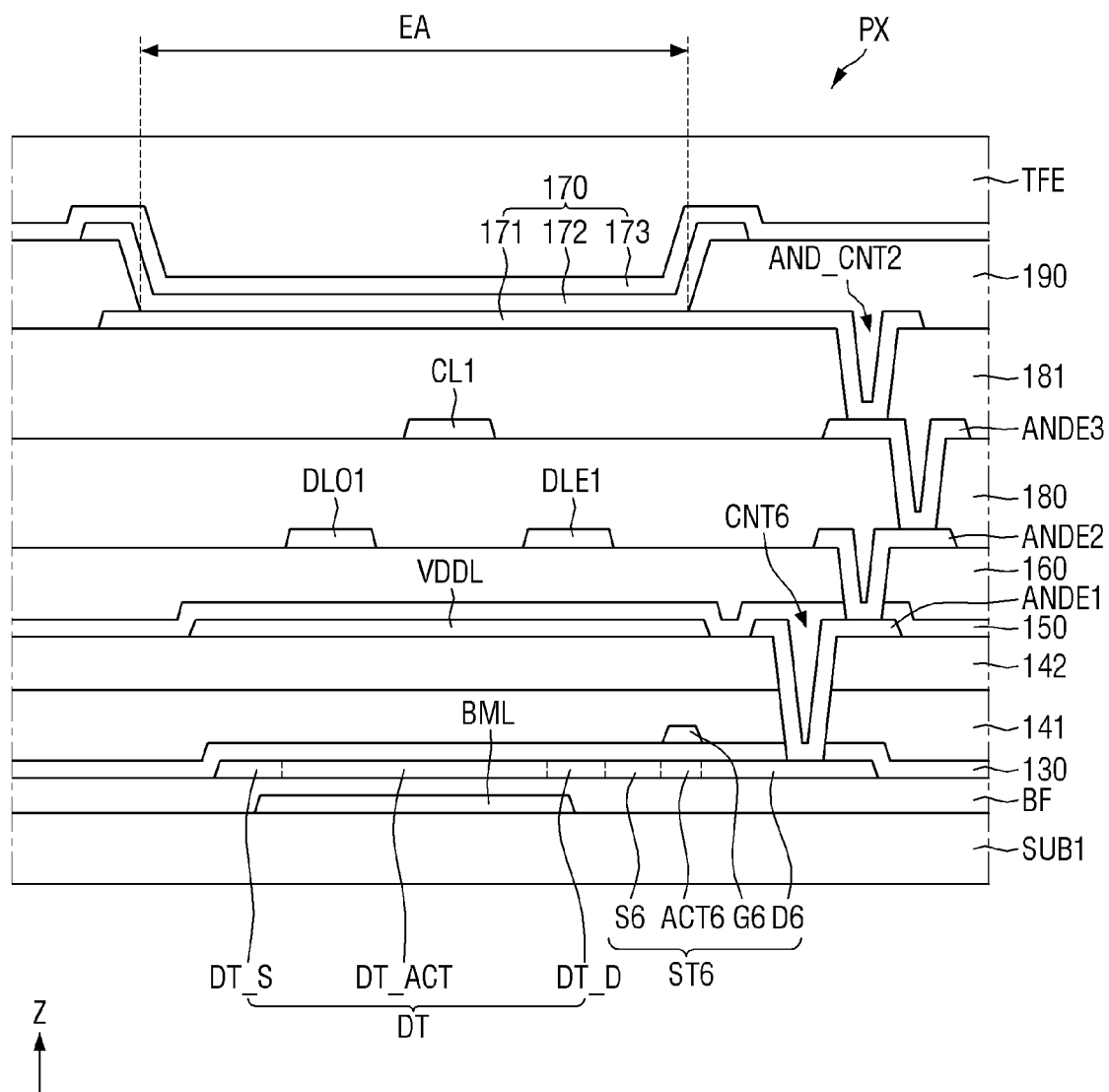
FIG. 25 is a cross-sectional view illustrating an embodiment of a subpixel of FIG. 24.

FIG. 25 is a cross-sectional view illustrating an embodiment of a subpixel of FIG. 24. Specifically, FIG. 25 illustrates a subpixel overlapping a first odd-numbered data line DLO1, a first even-numbered data line DLE1, and a first connection line CL1.

Referring to FIG. 25, a second power supply line VDDL may be formed of a first source metal layer DTL1, the first odd-numbered data line DLO1 and the first even-numbered data line DLE1 may be formed of a second source metal layer DTL2, and the first connection line CL1 may be formed of a third source metal layer DTL3. The first connection line CL1 may be connected to one of the first odd-numbered data line DLO1 and the first even-numbered data line DLE1. The first connection line CL1, the first odd-numbered data line DLO1, and the first even-numbered data line DLE1 may overlap a second power supply line VDDL.

The second power supply line VDDL may be disposed between the first connection line CL1 and a driving transistor DT, between the first connection line CL1 and a sixth transistor ST6, between the first odd-numbered data line DLO1 and the driving transistor DT, and between the first even-numbered data line DLE2 and the sixth transistor ST6. Due to the presence of the second power supply line VDDL, the first connection line CL1, the first odd-numbered data line DLO1, and the first even-numbered data line DLE1 may overlap the second power supply line VDDL. The second power supply line VDDL can prevent the occurrence of coupling between the first connection line CL1 and the driving transistor DT, between the first connection line CL1 and the sixth transistor ST6, between the first odd-numbered data line DLO1 and the driving transistor DT, and between the first even-numbered data line DLE2 and the sixth transistor ST6.

Figure 26:
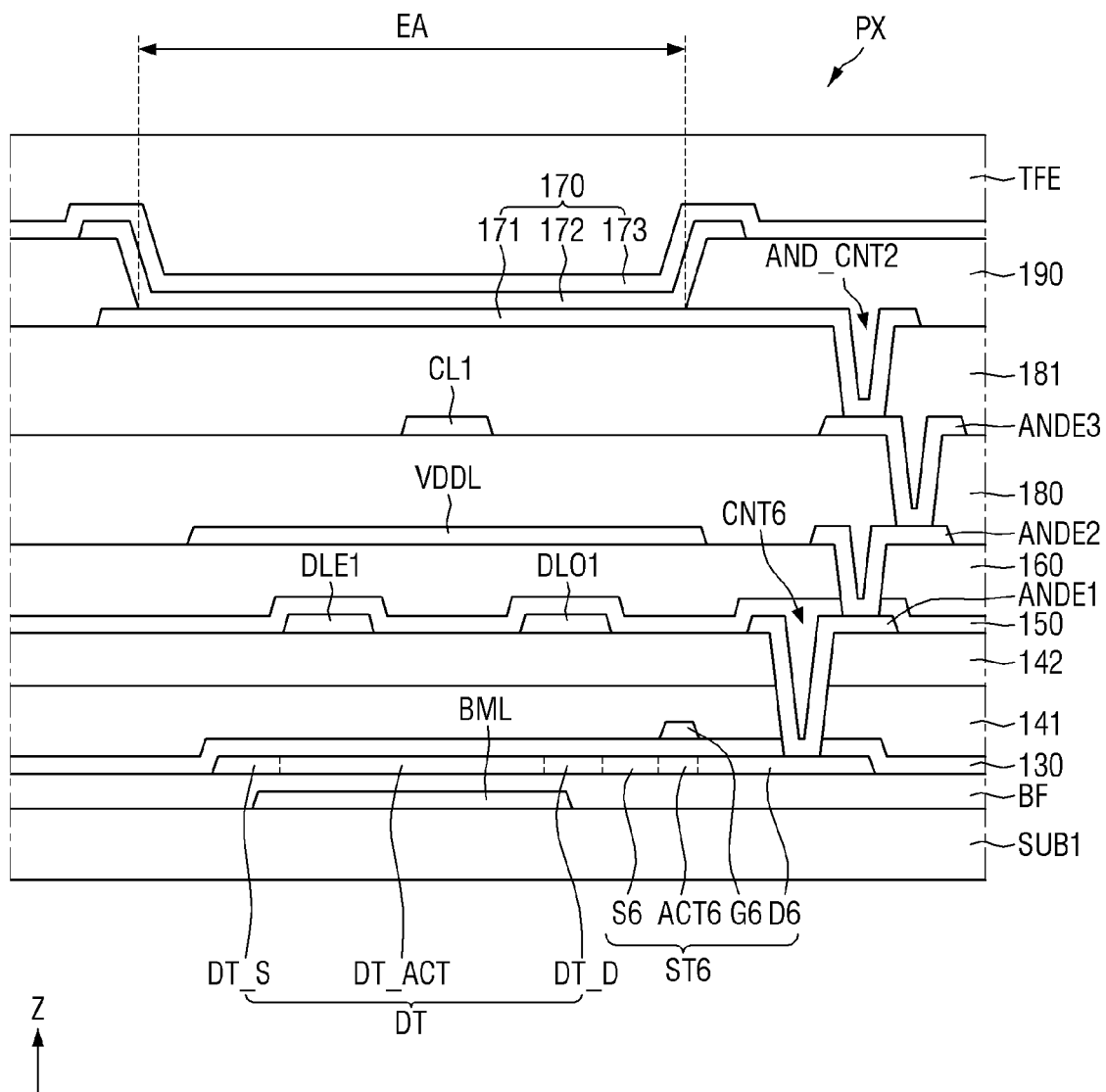
FIG. 26 is a cross-sectional view illustrating another embodiment of a subpixel of FIG. 24.

FIG. 26 is a cross-sectional view illustrating another embodiment of a subpixel of FIG. 24. Specifically, FIG. 26 illustrates a subpixel overlapping a first odd-numbered data line DLO1, a first even-numbered data line DLE1, and a first connection line CL1.

In the embodiment of FIG. 26, the first odd-numbered data line DLO1 and the first even-numbered data line DLE1 may be formed of a first source metal layer DTL1, and a second power supply line VDDL may be formed of a second source metal layer DTL2.

Figure 27:
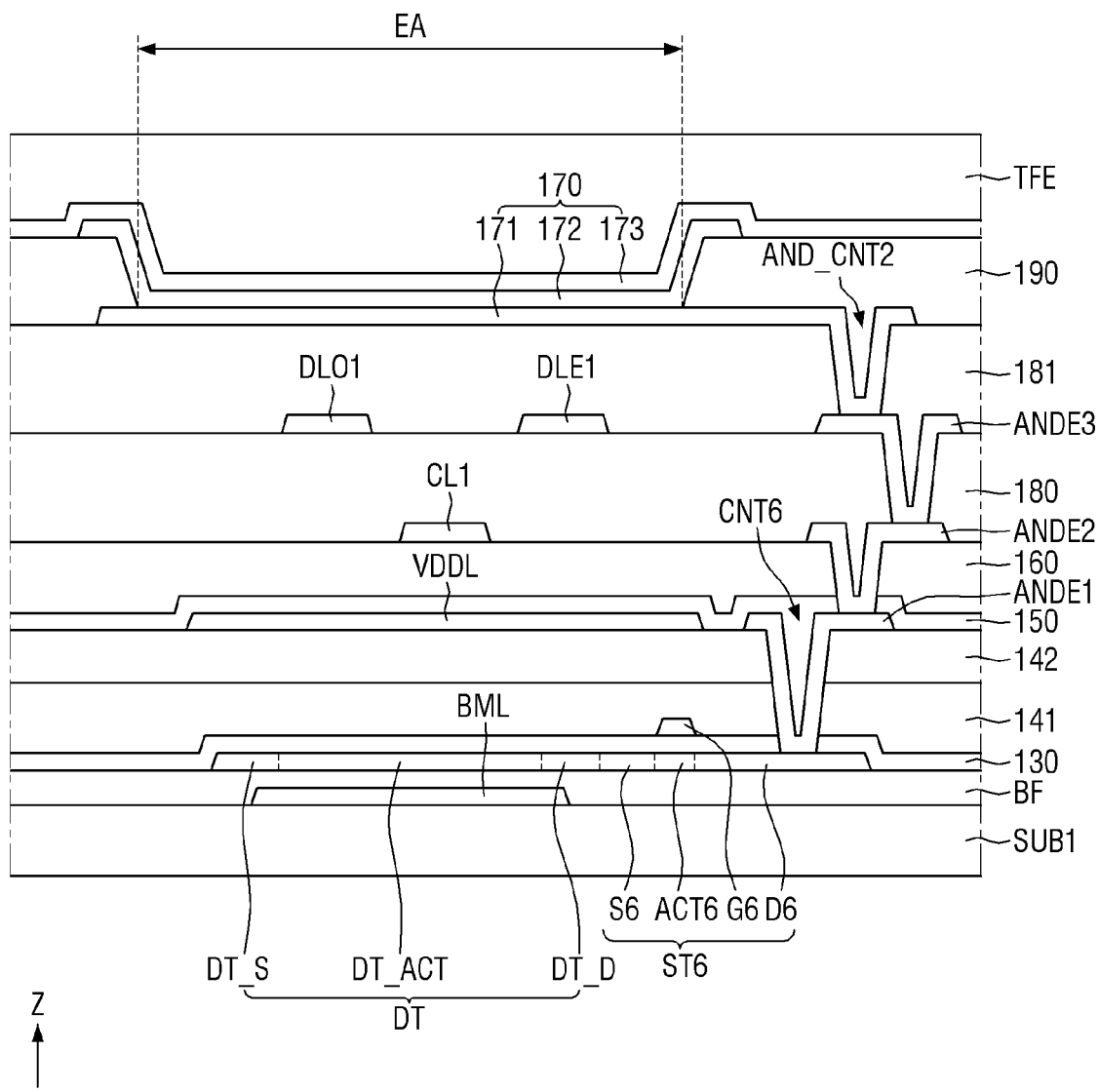
FIG. 27 is a cross-sectional view illustrating another embodiment of a subpixel of FIG. 24.

FIG. 27 is a cross-sectional view illustrating another embodiment of a subpixel of FIG. 24. Specifically, FIG. 27 illustrates a subpixel overlapping a first odd-numbered data line DLO1, a first even-numbered data line DLE1, and a first connection line CL1.

In the embodiment of FIG. 27, the first connection line CL1 may be formed of a second source metal layer DTL2, and the first odd-numbered data line DLO1 and the first even-numbered data line DLE1 may be formed of a third source metal layer DTL3.

Figure 28:
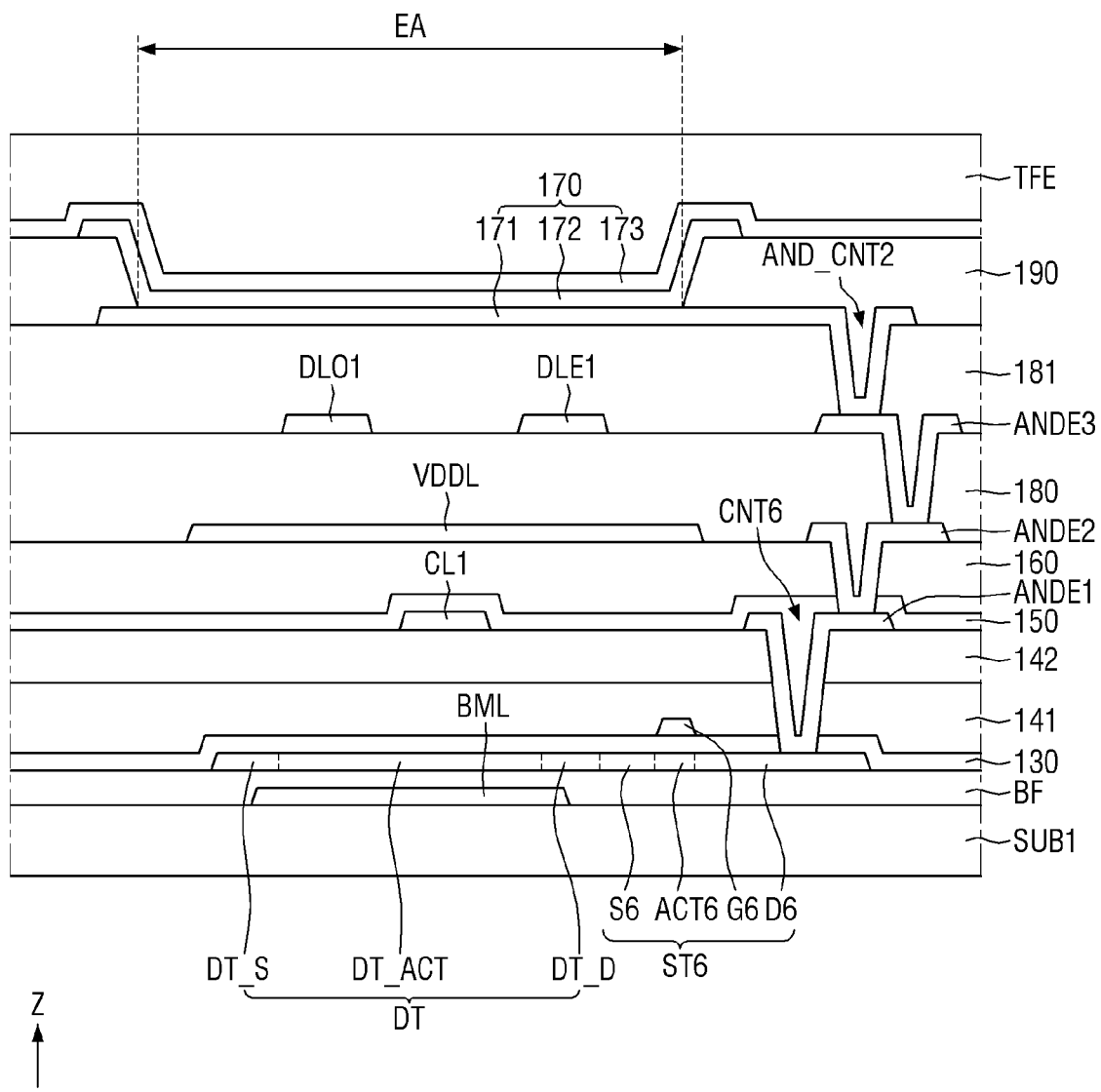
FIG. 28 is a cross-sectional view illustrating another embodiment of a subpixel of FIG. 24.

FIG. 28 is a cross-sectional view illustrating another embodiment of a subpixel of FIG. 24. Specifically, FIG. 28 illustrates a subpixel overlapping a first odd-numbered data line DLO1, a first even-numbered data line DLE1, and a first connection line CL1.

In the embodiment of FIG. 28, the first connection line CL1 may be formed of a first source metal layer DTL1, a second power supply line VDDL may be formed of a second source metal layer DTL2, and the first odd-numbered data line DLO1 and the first even-numbered data line DLE1 may be formed of a third source metal layer DTL3.

Figure 29:
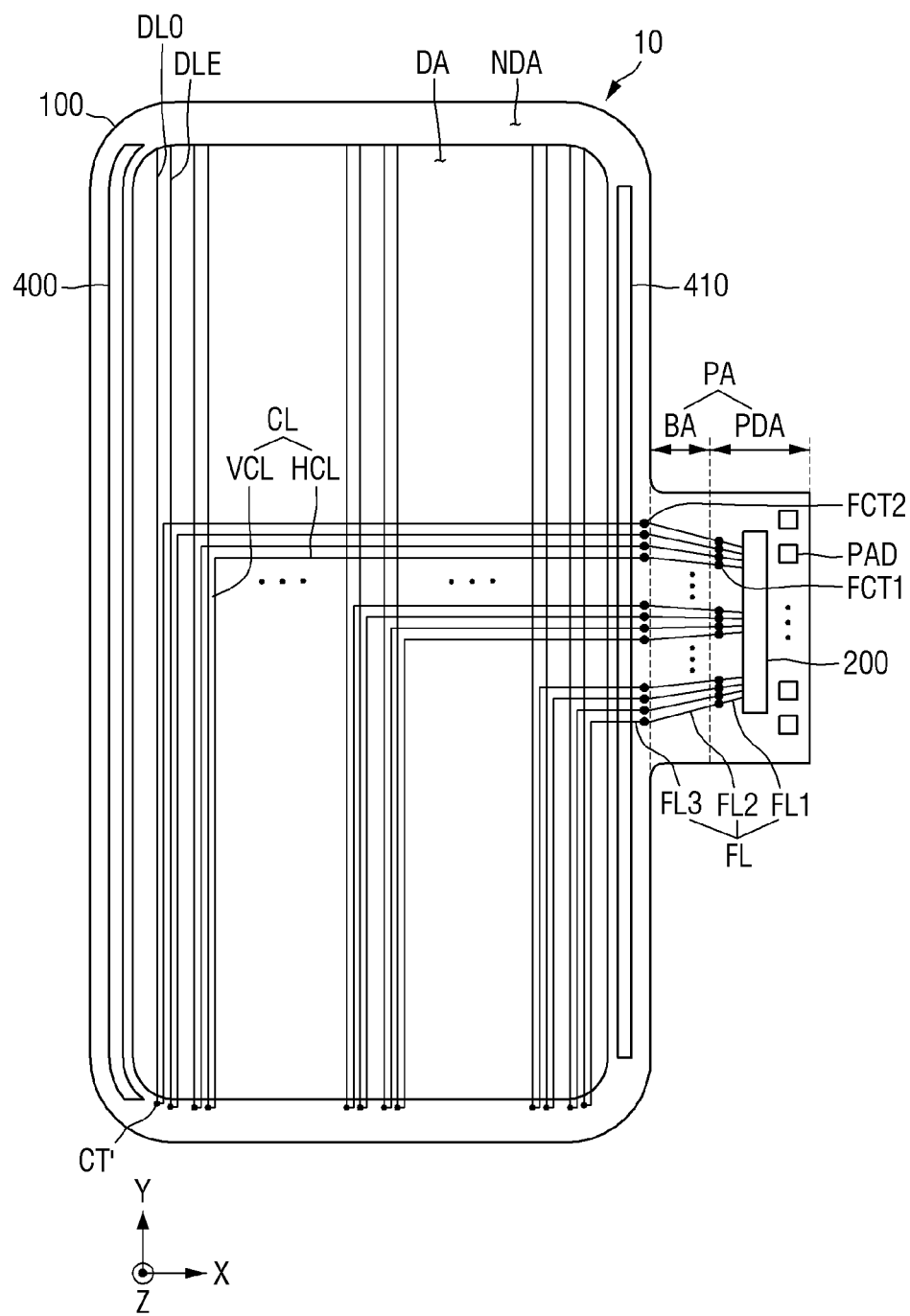
FIG. 29 is a plan view illustrating a display panel, a display driver, and a scan driver of a display device according to another embodiment.

FIG. 29 is a plan view illustrating a display panel, a display driver, and a scan driver of a display device according to another embodiment.

In the embodiment of FIG. 29, data lines may be provided in pairs so that each subpixel overlaps a pair of data lines (DLO and DLE), and that a display device 10 further includes a demultiplexer 410.

Referring to FIG. 29, odd-numbered data lines DLO and even-numbered data lines DLE may be connected to vertical connection lines VCL via connection holes CT'. The odd-numbered data lines DLO and the even-numbered data lines DLE may extend in a second direction (or an X-axis direction). The odd-numbered data lines DLO may be disposed adjacent to the respective even-numbered data lines DLE in a first direction (or an X-axis direction). For example, a first odd-numbered data line and a first even-numbered data line may be disposed adjacent to each other in the first direction (or the X-axis direction), and a second odd-numbered data line and a second even-numbered data line may be disposed adjacent to each other in the first direction (or the X-axis direction). The distance, in the first direction (or the X-axis direction), between the first odd-numbered data line and the first even-numbered data line may be smaller than the distance, in the first direction (or the X-axis direction), between the first even-numbered data line and the second odd-numbered data line.

A scan driver 400 may be disposed in a portion of a non-display area NDA at the outer left side of a display area DA. The demultiplexer 410 may be disposed in a portion of the non-display area NDA at the outer right side of the display area DA. The area of the demultiplexer 410 may be smaller than the area of the scan driver 400, and as a result, the length, in a second direction (or a Y-axis direction), of the demultiplexer 410 may be smaller than the length, in the second direction (or the Y-axis direction), of the scan driver 400.

The demultiplexer 410 may distribute data voltages applied to each fan-out line FL between connection lines CL. The number of fan-out lines FL connected to the demultiplexer 410 may be smaller than the number of connection lines CL connected to the demultiplexer 410. Since the number of fan-out lines FL disposed in a pad area PA can be reduced by half or more, the distance between the fan-out lines FL can be widened. That is, the complexity of wiring in the pad area PA can be reduced.

Third fan-out lines FL3 may be disposed in a portion of the non-display area NDA at the outer right side of the display area DA. In the portion of the non-display area NDA at the outer right side of the display area DA, the third fan-out lines FL3 may be connected to second fan-out lines FL2 via second wire connection holes FCT2.

The connection lines CL, the odd-numbered data lines DLO, and the even-numbered data lines DLE may be disposed in two of first, second, and third source metal layers DTL1, DTL2, and DTL3, as described above with reference to FIGS. 25 through 28.

Figure 30:
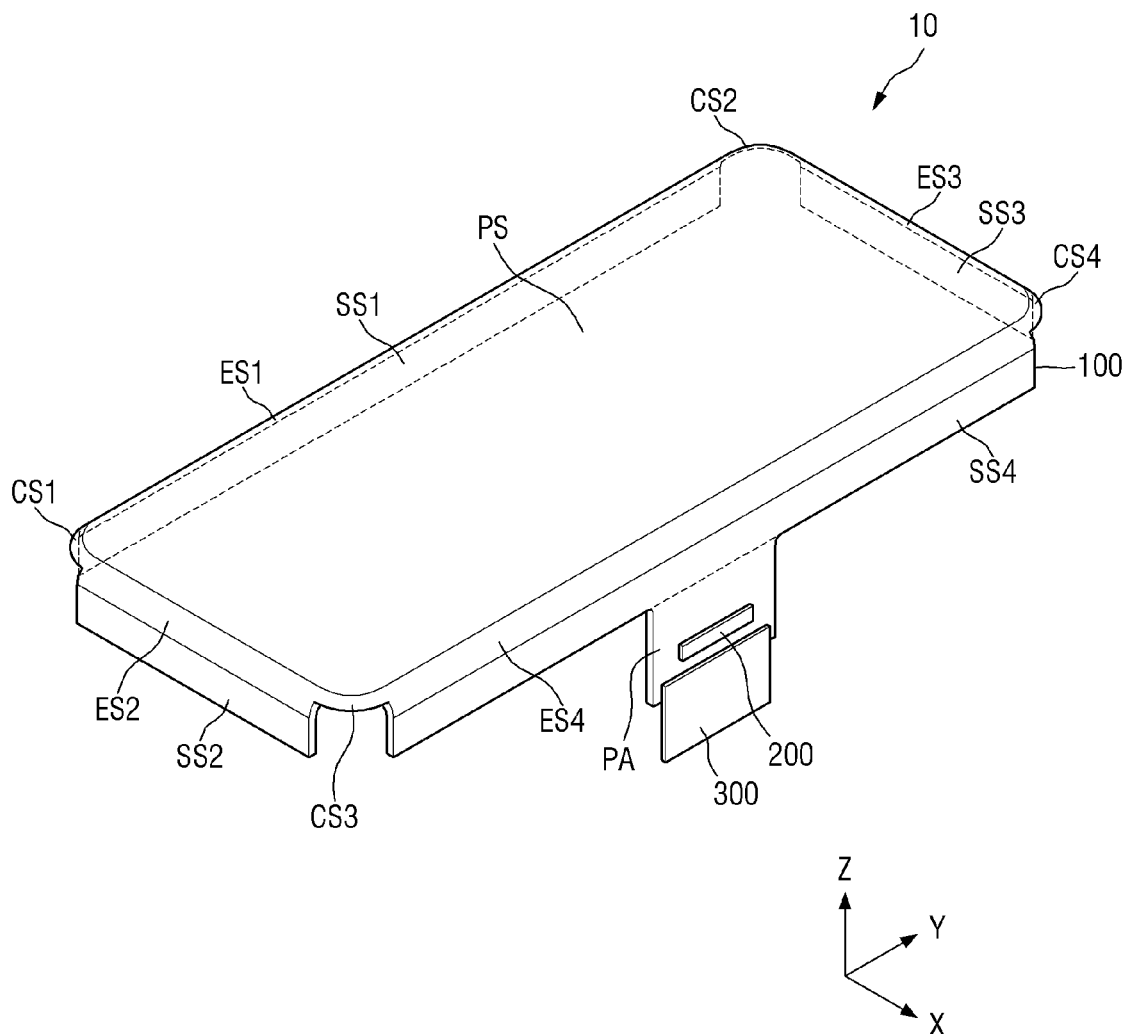
FIG. 30 is a perspective view of a display device according to another embodiment.
Figure 31:
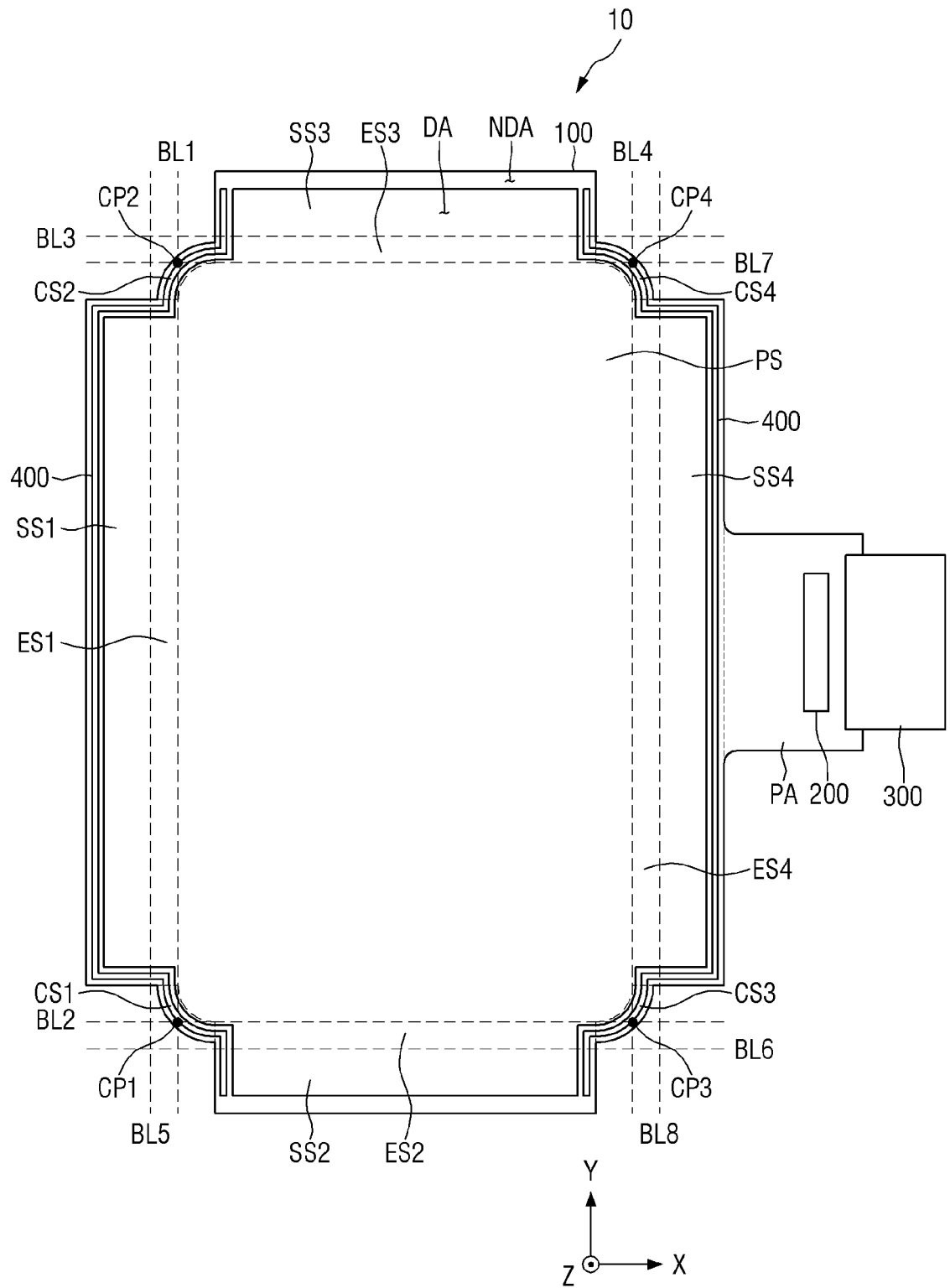
FIG. 31 is a development view of a display device according to another embodiment.

FIG. 30 is a perspective view of a display device according to another embodiment. FIG. 31 is a development view of a display device according to another embodiment.

In the embodiment of FIGS. 30 and 31, a display device 10 includes a plane part PS and four side parts, i.e., first, second, third, and fourth side parts SS1, SS2, SS3, and SS4.

Referring to FIGS. 30 and 31, a display panel 100 may include the plane part PS, the first, second, third, and fourth side parts SS1, SS2, SS3, and SS4, first, second, third, and fourth edge parts ES1, ES2, ES3, and ES4, and first, second, third, and fourth corner parts CS1, CS2, CS3, and CS4.

The plane part PS may be a surface that may not be curved, but flat. The plane part PS may be a rectangular surface having a pair of short sides extending in a first direction (or an X-axis direction) and a pair of long sides extending in a second direction (or a Y-axis direction). The corners where the short sides and the long sides of the plane part PS meet may be rounded to have a predetermined curvature. The plane part PS may be the top surface of the display panel 100.

The first edge part ES1 may extend from a first side of the plane part PS. The first edge part ES1 may extend from the left side of the plane part PS. The first edge part ES1 may be disposed between the plane part PS and the first side part SS1. The first edge part ES1 may be a surface curved with a predetermined curvature between first and fifth bending lines BL1 and BL5. The first bending line BL1 may be the boundary between the plane part PS and the first edge part ES1, and the fifth bending line BL5 may be the boundary between the first side part SS1 and the first edge part ES1.

The first side part SS1 may extend from a first side of the first edge part ES1. The first side part SS1 may be the left side of the display panel 100. The first side part SS1 may be a rectangular surface having a pair of short sides extending in a third direction (or a Z-axis direction) and a pair of long sides extending in the second direction (or the Y-axis direction).

The second edge part ES2 may extend from a second side of the plane part PS. The second edge part ES2 may extend from the left side of the plane part PS. The second edge part ES2 may be disposed between the plane part PS and the second side part SS2. The second edge part ES2 may be a surface curved with a predetermined curvature between second and sixth bending lines BL2 and BL6. The second bending line BL2 may be the boundary between the plane part PS and the second edge part ES2, and the sixth bending line BL6 may be the boundary between the second side part SS2 and the second edge part ES2.

The second side part SS2 may extend from a first side of the second edge part ES2. The second side part SS2 may be the lower side of the display panel 100. The second side part SS2 may be a rectangular surface having a pair of short sides extending in the third direction (or the Z-axis direction) and a pair of long sides extending in the first direction (or the X-axis direction).

The third edge part ES3 may extend from a third side of the plane part PS. The third edge part ES3 may extend from the upper side of the plane part PS. The third edge part ES3 may be disposed between the plane part PS and the third side part SS3. The third edge part ES3 may be a surface curved with a predetermined curvature between third and seventh bending lines BL3 and BL7. The third bending line BL3 may be the boundary between the plane part PS and the third edge part ES3, and the seventh bending line BL7 may be the boundary between the third side part SS3 and the third edge part ES3.

The third side part SS3 may extend from a first side of the third edge part ES3. The third side part SS3 may be the upper side of the display panel 100. The third side part SS3 may be a rectangular surface having a pair of short sides extending in the third direction (or the Z-axis direction) and a pair of long sides extending in the first direction (or the X-axis direction).

The fourth edge part ES4 may extend from a fourth side of the plane part PS. The fourth edge part ES4 may extend from the right side of the plane part PS. The fourth edge part ES4 may be disposed between the plane part PS and the fourth side part SS4. The fourth edge part ES4 may be a surface curved with a predetermined curvature between fourth and eighth bending lines BL4 and BL8. The fourth bending line BL4 may be the boundary between the plane part PS and the fourth edge part ES4, and the eighth bending line BL8 may be the boundary between the fourth side part SS4 and the fourth edge part ES4.

The fourth side part SS4 may extend from a first side of the fourth edge part ES4. The fourth side part SS4 may be the upper side of the display panel 100. The fourth side part SS4 may be a rectangular surface having a pair of short sides extending in the third direction (or the Z-axis direction) and a pair of long sides extending in the second direction (or the Y-axis direction).

The first corner part CS1 may be disposed between the first and second edge parts ES1 and ES2. Since the first corner part CS1 may not be disposed between the first and second side parts SS1 and SS2, an empty space may be provided between the first and second side parts SS1 and SS2. The width of the first corner part CS1 may be smaller than the widths of the first and second edge parts ES1 and ES2. Accordingly, as viewed from above the plane part PS, a first dead space may be provided on the outside of the first corner part CS1. The first dead space may be defined as an empty space in an area between the first and second edge parts ES1 and ES2, where the first corner part CS1 may not be disposed.

The second corner part CS2 may be disposed between the first and third edge parts ES1 and ES3. Since the second corner part CS2 may not be disposed between the first and third side parts SS1 and SS3, an empty space may be provided between the first and third side parts SS1 and SS3. The width of the second corner part CS2 may be smaller than the widths of the first and third edge parts ES1 and ES3. Accordingly, as viewed from above the plane part PS, a second dead space may be provided on the outside of the second corner part CS2. The second dead space may be defined as an empty space provided in an area, between the first and third edge parts ES1 and ES3, where the second corner part CS2 may not be disposed.

The third corner part CS3 may be disposed between the second and fourth edge parts ES2 and ES4. Since the third corner part CS3 may not be disposed between the second and fourth side parts SS2 and SS4, an empty space may be provided between the second and fourth side parts SS2 and SS4. The width of the third corner part CS3 may be smaller than the widths of the second and fourth edge parts ES2 and ES4. Accordingly, as viewed from above the plane part PS, a third dead space may be provided on the outside of the third corner part CS3. The third dead space may be defined as an empty space provided in an area between the second and fourth edge parts ES2 and ES4, where the third corner part CS3 may not be disposed.

The fourth corner part CS4 may be disposed between the third and fourth edge parts ES3 and ES4. Since the fourth corner part CS4 may not be disposed between the third and fourth side parts SS3 and SS4, an empty space may be provided between the third and fourth side parts SS3 and SS4. The width of the fourth corner part CS4 may be smaller than the widths of the third and fourth edge parts ES3 and ES4. Accordingly, as viewed from above the plane part PS, a fourth dead space DS4 may be provided on the outside of the fourth corner part CS4. The fourth dead space DS4 may be defined as an empty space provided in an area between the third and fourth edge parts ES3 and ES4, where the fourth corner part CS4 may not be disposed.

A first intersection point CP1 between the first and second bending lines BL1 and BL2 may overlap the first corner part CS1. A second intersection point CP2 between the first and seventh bending lines BL1 and BL7 may overlap the second corner part CS1. A third intersection point CP3 between the second and fourth bending lines BL2 and BL3 may overlap the third corner part CS3. A fourth intersection point CP4 between the fourth and seventh bending lines BL4 and BL7 may overlap the fourth corner part CS4.

A display area DA may be disposed in the plane part PS, the first, second, third, and fourth side parts SS1, SS2, SS3, and SS4, the first, second, third, and fourth edge parts ES1, ES2, ES3, and ES4, and the first, second, third, and fourth corner parts CS1, CS2, CS3, and CS4. A non-display area NDA may account for areas on the peripheries of the first, second, third, and fourth side parts SS1, SS2, SS3, and SS4, the first, second, third, and fourth edge parts ES1, ES2, ES3, and ES4, and the first, second, third, and fourth corner parts CS1, CS2, CS3, and CS4.

A pad area PA is illustrated as protruding from the right side of the fourth side part SS4, but the embodiments are not limited thereto. In other embodiments, the pad area PA may protrude from the left side of the first side part SS1.

While exemplary embodiments are described above, it is not intended that these embodiments describe all possible forms thereof. Rather, the words used in the specification are words of description rather than limitation, and it is understood that various changes may be made without departing from the spirit and scope of the of the disclosure. The features of various embodiments may be combined to form further embodiments.

What is claimed is:

1. A display device comprising:
a display area;
a non-display area disposed at a periphery of the display area;
a pad area protruding from the non-display area in a first direction;
a plurality of scan lines disposed in the display area and extending in the first direction;
a plurality of data lines disposed in the display area and extending in a second direction which intersects the first direction;
a plurality of connection lines disposed in the display area and extending in the first direction;
a plurality of first power supply lines extending in the first direction and receiving a first power supply voltage; and
a plurality of second power supply lines extending in the second direction and receiving a second power supply voltage which is higher than the first power supply voltage, wherein
a connection line among the plurality of connection lines is connected to a data line among the plurality of data lines via a connection hole located in the display area.

2. The display device of claim 1, wherein the plurality of connection lines do not overlap the plurality of scan lines.

3. The display device of claim 1, wherein a length of the display area in the first direction is smaller than a length of the display area in the second direction.

4. The display device of claim 1, wherein the connection hole penetrates at least one insulating film disposed between the connection line and the data line.

5. The display device of claim 1, wherein a first power supply line among the plurality of first power supply lines overlap the connection line.

6. The display device of claim 1, wherein the connection hole is disposed in an overlapping area of a first data line of the plurality of data lines and the first power supply line.

7. The display device of claim 1, further comprising:
a scan driver disposed in a portion of the non-display area between the display area and the pad area, and connected to the plurality of scan lines, the pad area including a bending area and a first sub-pad area, the bending area being disposed between the non-display area and the first sub-pad area, the bending area to fold the first sub-pad area underneath the display area.

8. The display device of claim 7, further comprising:
a plurality of fan-out lines disposed in the pad area and connected to the connection lines; and
a display driver disposed in the pad area and connected to the fan-out lines.

9. The display device of claim 1, further comprising:
a scan driver disposed in a portion of the non-display area at a first outer side of the display area, and
wherein the plurality of connection lines do not overlap the scan driver.

10. The display device of claim 1, further comprising:
a first scan driver disposed in a portion of the non-display area at a first outer side of the display area; and
a second scan driver disposed in a portion of the non-display area at a second outer side of the display area.

11. The display device of claim 10, wherein the plurality of connection lines overlap one of the first scan driver and the second scan driver.

12. The display device of claim 10, wherein the first scan driver is connected to odd-numbered scan lines among the plurality of scan lines, and the second scan driver is connected to even-numbered scan lines among the plurality of scan lines.

13. A display device comprising:
a display area;
a non-display area disposed at a periphery of the display area;
a pad area protruding from the non-display area in a first direction;
a plurality of scan lines disposed in the display area and extending in the first direction;
a plurality of data lines disposed in the display area and extending in a second direction which intersects the first direction;
a plurality connection lines disposed in the display area and extending in the first direction; and
a scan driver disposed in a portion of the non-display area between the display area and the pad area, and connected to the plurality of scan lines, wherein
a connection line among the plurality of connection lines is connected to a data line among the plurality of data lines via a connection hole located in the display area, and
the plurality of connection lines overlap the scan driver.

14. A display device comprising:
a display area;
a non-display area disposed at a periphery of the display area;
a pad area protruding from the non-display area in a first direction;
a plurality of scan lines disposed in the display area and extending in the first direction;
a plurality of data lines disposed in the display area and extending in a second direction which intersects the first direction;
a plurality of first connection lines disposed in the display area and extending in the first direction; and
a plurality of second connection lines disposed in the display area and extending in the second direction,
wherein a first connection line among the plurality of first connection lines is connected to a second connection line among the plurality of second connection lines.

15. The display device of claim 14, wherein the second connection line is connected to a data line among the plurality of data lines via a connection hole located in the non-display area.

16. The display device of claim 14, further comprising:
a plurality of first power supply lines extending in the first direction and receiving a first power supply voltage; and
a plurality of second power supply lines extending in the second direction and receiving a second power supply voltage which is higher than the first power supply voltage.

17. The display device of claim 16, wherein a second power supply line among the plurality of second power supply lines overlap the second connection line.

18. The display device of claim 16, wherein a first power supply line among the plurality of first power supply lines overlap the first connection line.

19. The display device of claim 14, wherein the plurality of first connection lines do not overlap the plurality of scan lines.

* * * * *